US012619149B2

(12) United States Patent
Liu et al.

(10) Patent No.: US 12,619,149 B2
(45) Date of Patent: May 5, 2026

(54) DNQ-FREE CHEMICALLY AMPLIFIED RESIST COMPOSITION

(71) Applicant: Merck Patent GmbH, Darmstadt (DE)

(72) Inventors: Weihong Liu, Branchburg, NJ (US); Chunwei Chen, Whitehouse Station, NJ (US)

(73) Assignee: Merck Patent GmbH, Darmstadt (DE)

(*) Notice: Subject to any disclaimer, the term of this patent is extended or adjusted under 35 U.S.C. 154(b) by 894 days.

(21) Appl. No.: 17/907,103

(22) PCT Filed: Apr. 23, 2021

(86) PCT No.: PCT/EP2021/060678
§ 371 (c)(1),
(2) Date: Sep. 23, 2022

(87) PCT Pub. No.: WO2021/219509
PCT Pub. Date: Nov. 4, 2021

(65) Prior Publication Data

US 2023/0112024 A1 Apr. 13, 2023

Related U.S. Application Data

(60) Provisional application No. 63/015,813, filed on Apr. 27, 2020.

(51) Int. Cl.
*G03F 7/039* (2006.01)
*G03F 7/20* (2006.01)
*G03F 7/38* (2006.01)

(52) U.S. Cl.
CPC .......... *G03F 7/0392* (2013.01); *G03F 7/2004* (2013.01); *G03F 7/38* (2013.01)

(58) Field of Classification Search
CPC .... G03F 7/0392; G03F 7/2004; G03F 7/0397; G03F 7/004; C08F 220/30
See application file for complete search history.

(56) References Cited

U.S. PATENT DOCUMENTS

2001/0024765 A1 9/2001 Okazaki et al.
2013/0337380 A1* 12/2013 Liu ...................... G03F 7/0397 430/326

(Continued)

FOREIGN PATENT DOCUMENTS

TW 201823861 A 7/2018
WO 2021/219509 A1 11/2021

OTHER PUBLICATIONS

International Search Report and Written Opinion received for PCT Application No. PCT/EP2021/060678, mailed on Jul. 30, 2021, 10 Pages.

*Primary Examiner* — Jonathan Johnson
*Assistant Examiner* — Alexander N. Lee
(74) *Attorney, Agent, or Firm* — EMD Performance Materials Corp.

(57) ABSTRACT

The disclosed subject matter relates to resist compositions that include: (A) an acetal functionalized acrylic polymer component comprising repeat units selected from ones having structure (1), (2), (3), (4), (5), (6), and (7); (B) a tert-alkyl functionalized acrylic polymer component comprising repeat units selected from ones having structure (1a), (2a), (3a), (4a), (5a), (6a), and (7a); (C) a phenolic resin component comprising a Novolak-based resin; (D) a photo acid generator (PAG) component and (E) a solvent component where the resist compositions does not include a diazonaphthoquinone (DNQ) component.

20 Claims, 1 Drawing Sheet

(56) References Cited

U.S. PATENT DOCUMENTS

| | | | |
|---|---|---|---|
| 2016/0231651 A1 | 8/2016 | Yamamoto et al. | |
| 2016/0291469 A1 | 10/2016 | Katayama et al. | |
| 2017/0168393 A1 | 6/2017 | Sugihara et al. | |
| 2019/0064662 A1* | 2/2019 | Liu | G03F 7/0045 |

* cited by examiner

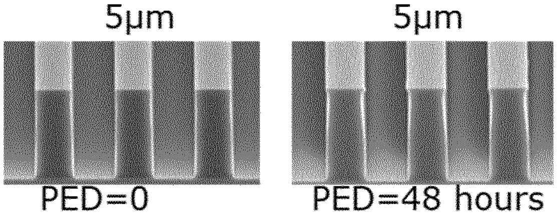
5μm
5μm
PED=0
PED=48 hours

DNQ-FREE CHEMICALLY AMPLIFIED RESIST COMPOSITION

This application is a national stage application, filed under 35 U.S.C. § 371, of International Patent Application No. PCT/EP2021/060678 (filed on 23 Apr. 2021) which claims the benefit of U.S. Provisional Patent Application No. 63/015,813 (filed on 27 Apr. 2020) each of which applications is incorporated herein by reference in their entirety.

FIELD

The disclosed subject matter pertains to a positive radiation-sensitive aqueous base soluble photoresist composition used for making integrated circuit (IC), light emitting diode (LED) devices and display devices.

BACKGROUND

Photoresist compositions are used in microlithographic processes for making miniaturized electronic components such as in the fabrication of computer chips, integrated circuits, light emitting diode (LED) devices and displays. Generally, in these processes, a film of a photoresist composition is first applied to a substrate material, such as silicon wafers used for making integrated circuits. The coated substrate is then baked to evaporate solvent in the photoresist composition and to fix the coating onto the substrate. The baked, coated surface of the substrate is next subjected to an image-wise exposure to imaging radiation.

This radiation exposure causes a chemical transformation in the exposed areas of the coated surface. Visible light, ultraviolet (UV) light, electron beam and X-ray radiant energy are imaging radiation types commonly used today in microlithographic processes. After this image-wise exposure, the coated substrate is treated with a developer solution to dissolve and remove either the radiation-exposed or the unexposed areas of the coated surface of the substrate.

There are two types of photoresist compositions, negative-working and positive-working. When positive-working photoresist compositions are exposed image-wise to radiation, the areas of the resist composition exposed to the radiation become more soluble to a developer solution (e.g., release of base solubilizing group or photo-decomposition of dissolution inhibitor), while the unexposed areas of the photoresist coating remain relatively insoluble to such a solution. Thus, treatment of an exposed positive-working resist with a developer causes removal of the exposed areas of the photoresist coating and the creation of a positive image in the coating, thereby uncovering a desired portion of the underlying substrate surface on which the photoresist composition was deposited.

The use of a positive-working, sensitive photoresist composition which is developable by aqueous base is known. Most of these compositions are either chemically amplified photoresists based on either phenolic or (meth)acrylate resin or non-chemically amplified photoresists based on Novolak/diazonaphthoquinone (DNQ). In a Novolak/DNQ photoresist a positive image is formed through the photodecomposition of the diazonaphthoquinone compound (PAC) which in resist areas exposed leads to a faster dissolution of the Novolak resin in aqueous base, these types of photoresists are employed at longer UV wavelengths such as i-line (365 nm), and were for many years workhorse photoresists in the manufacturing of integrated circuits (IC).

In chemically amplified positive photoresists, a base soluble resin, usually a phenolic resin or (meth)acrylate resin, is released in areas of the resist exposed to radiation, rendering it aqueous base developable, by an acid catalyzed cleavage of protecting groups on these resins, originally masking the base solubilizing moieties. In these chemically amplified photoresists, the catalytic acid is formed by photodecomposition of a photo-acid generator (PAG) component. These types of resists are typically employed at shorter wavelengths in quest for higher resolution in the manufacture of IC's.

For thick film applications, conventional Novolak/DNQ resist platforms produce sloped profiles, particularly at thicker films due to their high film absorption. Positive chemically amplified (CA) platforms, on the other hand can provide adequate performance over 5 to 10 μm film thickness, however the polymers conventionally used for these resists, are much more expensive than conventional Novolak resins. Also, certain designs for positive chemically amplified resists which require a post exposure bake may have a deleterious effect on IC device throughput because of poor post exposure delay latitude between exposure and post-exposure bake prior to development in aqueous base. Cost and device throughput are also an issue for applications pertaining to the manufacture of displays, however, here the thickness requirements for resists in this application are lower (1 to 3 μm). The potential effect on device throughput issue occurs in certain chemically amplified resists in which the protecting groups, masking the base solubilizing moiety, have a high activation energy acid for their cleavage, in order unmask the base solubilizing moiety. Although these high activation energy groups are removable catalytically by acid, this removal requires a post exposure bake step (PEB), however in positive high activation energy chemically amplified resists, there is sensitivity to airborne base contamination. This occurs because in order to have good resolution these resists have a high degree of non-linearity between the extent of cleavage of the high activation energy group and dissolution of an exposed resist film. Thus, even a small depletion of acid at the surface after exposure will in the delay time between exposure and bake cause a lower degree of deprotection of these groups at the surface which will manifest itself as an insoluble resist surface layer. This post exposure delay (PED) effect is called "T-topping" because of the resulting positive images formed have a large undesirable T-shape, which causes defects in manufacturing, and lower device yields. Another aspect of the disclosed and claimed subject matter is a reduction of the time of the post exposure delay (PED).

One aspect of the disclosed subject matter is to provide a cost competitive, resist formulation based on a hybrid between a conventional Novolak-based resist and two different types of chemically amplified resists that does not utilize a DNQ compound which may be employed either in relatively thin film (1 to 2 μm) applications in the manufacture of displays, but is also flexible enough to be used in thick film applications (3 to 10 μm) that shows little or no effect of a post exposure delay (PED) of up to 48 hours. Specifically, these novel formulations comprise three polymer components, firstly an aqueous base soluble (e.g. 0.26 N TMAH) Novolak polymer, secondly a (meth)acrylate polymer which comprises (meth)acrylic acid repeat units blocked by an acetal low activation energy acid labile group and thirdly a (meth)acrylate polymer which comprises (meth)acrylic acid repeat units protected with high activation energy tertiary-alkyl protecting groups.

In applications, requiring a thinner resist film, the novel hybrid resist systems described herein may be formulated with larger amounts of Novolak polymer, as absorbance is not as crucial. Advantageously, this approach provides for thin film photoresists which have high resolution and contrast, but which can withstand very long post-exposure delays (PED) between exposure and post-exposure bake off up to 48 hours. This increasing manufacturing throughput and reducing the possibility of deleterious post exposure delay (PED) effects such as formation of featuring having a large extent of T-topping or line slimming. Although not bound by theory, the large PED latitude of these materials may be because the low activation energy acetal protecting groups, and the high activation energy protecting groups in the two polymers compensate for each other. In formulations containing only an acetal protected (meth)acrylate polymer although these protecting groups are fully deprotected during the exposure phase prior to the post-exposure bake and show no T-topping, an increase in PED may lead to diffusion from the exposed to unexposed areas leading to line slimming and a decrease in the exposure dose for L/S features. It appears that, unexpectedly, the addition of a tertiary alkyl protected (meth)acrylate polymer to the formulation compensates for this diffusion problem and leads to good PED latitude towards line slimming without imparting a T-topping PED effect which is normally associated with a high activation energy positive chemically amplified resist component.

Finally, in either the thick film or thin film variations of this novel hybrid resist system these are low cost resist platforms that are simple to prepare.

SUMMARY

The resist compositions disclosed and claimed herein are chemically amplified resist compositions that include:

(A) An acetal functionalized acrylic polymer component comprising repeat units selected from ones having structure (1), (2), (3), (4), (5), (6), and (7):

(1)

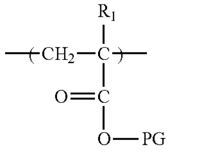

(2)

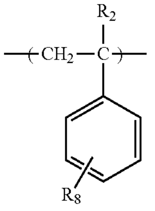

(3)

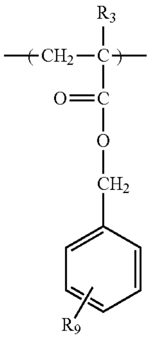

-continued (4)

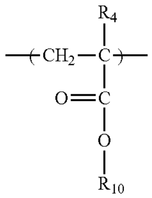

(5)

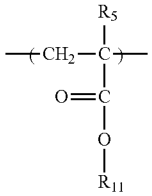

(6)

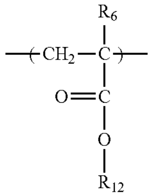

(7)

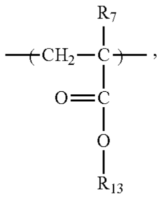

wherein PG is an acid cleavable acetal protecting group, wherein said repeat units constitute 100 mole % of the repeat units in said acetal functionalized acrylic polymer, the repeat unit of structure (1) ranges from about 10 mole % to about 35 mole % of the acrylic polymer, the repeat unit of structure (2) ranges from about 0 mole % to about 20 mole % of the acrylic polymer, wherein the repeat unit of structure (3) ranges from about 15 mole % to about 55 mole % of the acrylic polymer, wherein the repeat unit of structure (4) ranges from about 0 mole % to about 30 mole % of the acrylic polymer, the repeat unit of structure (5) ranges from about 15 mole % to about 55 mole % of the acrylic polymer, the repeat unit of structure (6) ranges from about 0 mole % to about 40 mole % of the acrylic polymer, the repeat unit of structure (7) ranges from about 0 mole % to about 25 mole % of the acrylic polymer, $R_1$, $R_2$, $R_3$, $R_4$, $R_5$, $R_6$, and $R_7$ are individually selected from either H, F, a C-1 to C-4 perfluoroalkyl, or a C-1 to C-4 alkyl, $R_8$ and $R_9$ are individually selected from H, a C-1 to C-4 alkyl, a C-1 to C-4 alkyloxy alkyl, and a halogen, $R_{10}$ is selected from the group consisting of a C-1 to C-8 primary alkyl, a C-3 to C-8 secondary alkyl, a C-3 to C-8 cyclic secondary alkyl, and a C-7 to C-14 alicyclic secondary alkyl, $R_{11}$ is a C-2 to C-8 (hydroxy)alkylene moiety, $R_{12}$ is a tertiary alkyl acid cleavable group, $R_{13}$ is a C-3 to C-12, (alkyloxy)alkylene moiety, and the acrylic polymer preferably comprises about 0.5 wt % solids to about 70 wt % solids;

(B) A tert-alkyl functionalized acrylic polymer component comprising repeat units selected from ones having structure (1a), (2a), (3a), (4a), (5a), (6a), and (7a):

(1a)

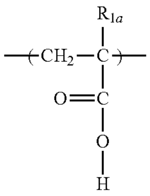

(2a)

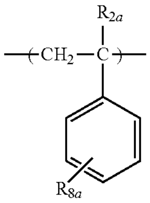

(3a)

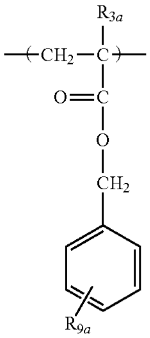

(4a)

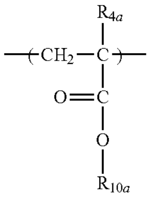

(5a)

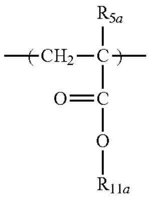

(6a)

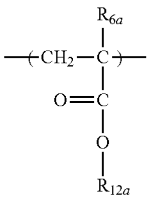

-continued (7a)

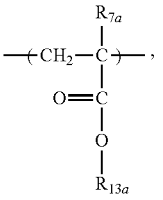

wherein the repeat units constitute 100 mole % of the repeat units in said tert-alkyl functionalized acrylic polymer, the repeat unit of structure (1a) ranges from about 0 mole % to about 15 mole % of the acrylic polymer, the repeat unit of structure (2a) ranges from about 0 mole % to about 20 mole % of the acrylic polymer, the repeat unit of structure (3a) ranges from about 0 mole % to about 30 mole % of the acrylic polymer, the repeat unit of structure (4a) ranges from about 0 mole % to about 30 mole % of the acrylic polymer, wherein the repeat unit of structure (5a) ranges from about 15 mole % to about 40 mole % of the acrylic polymer, wherein the repeat unit of structure (6a) ranges from about 30 mole % to about 45 mole % of the acrylic polymer, the repeat unit of structure (7a) ranges from about 0 mole % to about 20 mole % of the acrylic polymer, $R_{1a}$, $R_{2a}$, $R_{3a}$, $R_{4a}$, $R_{5a}$, $R_{6a}$, and $R_{7a}$ are individually selected from either H, F, a C-1 to C-4 perfluoroalkyl, or a C-1 to C-4 alkyl, $R_{8a}$ and $R_{9a}$ are individually selected from H, a C-1 to C-4 alkyl, a C-1 to C-4 alkyloxy alkyl, and a halogen, $R_{10a}$ is selected from the group consisting of a C-1 to C-8 primary alkyl, a C-3 to C-8 secondary alkyl, a C-3 to C-8 cyclic secondary alkyl, and a C-7 to C-14 secondary alicyclic alkyl, $R_{11a}$ is a C-2 to C-8 (hydroxy)alkylene moiety, $R_{12a}$ is a tertiary alkyl acid cleavable group, and $R_{13a}$ is a C-3 to C-12, (alkyloxy)alkylene moiety;

(C) A phenolic resin component comprising a Novolak-based resin;

(D) A photo acid generator (PAG) component; and (E) A solvent component.

Wherein said resist compositions do not include a diazonaphthoquinone (DNQ) component.

The above resists composition can further include one or more optional components such as, but not limited to, acid quenchers, auxiliary resins, thiols, plasticizers, surface leveling agents and stabilizers.

In a further embodiment, the resist compositions disclosed and claimed herein consist essentially of the forgoing ingredients in varying concentrations without the presence of an added DNQ. In such an embodiment, the combined amounts of the ingredients do not equal 100% by weight and can include other ingredients that do not materially change the effectiveness of the resist composition.

In a still further embodiment, the resist compositions disclosed and claimed herein consist of ingredients (A), (B), (C), (D), and (E) in varying concentrations. In such an embodiment, the combined amounts of ingredients (A), (B), (C), (D, and (E) equal approximately 100% by weight but may include other small and/or trace amounts of impurities that are present in such small quantities that they do not materially change the effectiveness of the resist composition.

Notably, the resist compositions disclosed and claimed herein do not require or include any kind of diazonaphthoquinone (DNQ) components for example DNQ photoactive dissolution inhibitor compound, or a DNQ compound which acts as both a photoactive dissolution inhibitor compound and also act as a source of sulfonic photoacid that can deprotect acid labile groups on the acrylate polymer components (A) or (B). Further, when used in lithographic processes the disclosed resists eliminate and/or minimize the need for a post exposure bake (PEB) step and increase post exposure delay (PED) time latitude.

The disclosed subject matter also pertains to the method of coating the resist compositions on a substrate as part of a lithographic process.

BRIEF DESCRIPTION OF THE FIGURES

The accompanying drawings, which are included to provide a further understanding of the disclosed subject matter and are incorporated in and constitute a part of this specification, illustrate embodiments of the disclosed subject matter and together with the description serve to explain the principles of the disclosed subject matter.

FIG. 1 Illustrates the PED latitude of Formulation 8, where no change in resist profile for 5 μm L/S features at a resolution dose of 180 $mJ/cm^2$ is seen after a 48-hour delay between exposure and post exposure bake prior to development in aqueous base.

DETAILED DESCRIPTION

It is to be understood that both the foregoing general description and the following detailed description are illustrative and explanatory and are not restrictive of the subject matter as claimed. In this application, the use of the singular includes the plural, the word "a" or "an" means "at least one," and the use of "or" means "and/or," unless specifically stated otherwise. Furthermore, the use of the term "including," as well as other forms such as "includes" and "included," is not limiting. Also, terms such as "element" or "component" encompass both elements and components comprising one unit and elements or components that comprise more than one unit, unless specifically stated otherwise. As used herein, the conjunction "and" is intended to be inclusive and the conjunction "or" is not intended to be exclusive unless otherwise indicated. For example, the phrase "or, alternatively" is intended to be exclusive. As used herein, the term "and/or" refers to any combination of the foregoing elements including using a single element.

The section headings used herein are for organizational purposes and are not to be construed as limiting the subject matter described. All documents, or portions of documents, cited in this application, including, but not limited to, patents, patent applications, articles, books, and treatises, are hereby expressly incorporated herein by reference in their entirety for any purpose. In the event that one or more of the incorporated literature references and similar materials defines a term in a manner that contradicts the definition of that term in this application, this application controls.

The term "linking point," when referring to any of the inventive polymers refers to a branching point to another polymer chain and/or a crosslinking point to another polymer chain, where the extent of branching and/or crosslinking is such that the resultant branched and/or crosslinked polymer still has a molecular weight sufficiently low so as to avoid reaching the gel point where the polymer would become insoluble in solvents such as spin-casting solvents.

Unless otherwise indicated, "alkyl" refers to hydrocarbon groups which can be linear, branched (e.g., methyl, ethyl, propyl, isopropyl, tert-butyl and the like) or cyclic (e.g., cyclohexyl, cyclopropyl, cyclopentyl and the like) or multicyclic (e.g., norbornyl, adamantly and the like). These alkyl moieties may be substituted or unsubstituted as described below. The term "alkyl" refers to such moieties with C-1 to C-20 carbons. It is understood that for structural reasons linear alkyls start with C-1, while branched alkyls and cyclic alkyls start with C-3 and multicyclic alkyls start with C-5. Moreover, it is further understood that moieties derived from alkyls described below, such as alkyloxy and haloalkyloxy, have the same carbon number ranges unless otherwise indicated. If the length of the alkyl group is specified as other than described above, the above described definition of alkyl still stands with respect to it encompassing all types of alkyl moieties as described above and that the structural consideration with regards to minimum number of carbons for a given type of alkyl group still apply.

Alkyloxy (a.k.a. Alkoxy) refers to an alkyl group on which is attached through an oxy (—O—) moiety (e.g. methoxy, ethoxy, propoxy, butoxy, 1,2-isopropoxy, cyclopentyloxy cyclohexyloxy and the like). These alkyloxy moieties may be substituted or unsubstituted as described below.

Halo or halide refers to a halogen, F, Cl, Br or I which is linked by one bond to an organic moiety.

Haloalkyl refers to a linear, cyclic or branched saturated alkyl group such as defined above in which at least one of the hydrogens has been replaced by a halide selected from the group of F, C1, Br, I or mixture of these if more than one halo moiety is present. Fluoroalkyls are a specific subgroup of these moieties.

Fluoroalkyl refers to a linear, cyclic or branched saturated alkyl group as defined above in which the hydrogens have been replaced by fluorine either partially or fully (e.g., trifluoromethyl, pefluoroethyl, 2,2,2-trifluoroethyl, prefluoroisopropyl, perfluorocyclohexyl and the like). These fluoroalkyl moieties, if not perfluorinated, may be substituted or unsubstituted as described below.

Fluoroalkyloxy refers to a fluoroalkyl group as defined above on which is attached through an oxy (—O—) moiety it may be completed fluorinated (a.k.a. perfluorinated) or alternatively partially fluorinated (e.g., trifluoromethyoxy, perfluoroethyloxy, 2,2,2-trifluoroethoxy, perfluorocyclohexyloxy and the like). These fluoroalkyl moieties, if not pefluorinated may, be substituted or unsubstituted as described below.

Herein when referring to an alkyl, alkyloxy, fluoroalkyl, fluoroalkyloxy moieties with a possible range of carbon atoms which starts with C-1 such as for instance "C-1 to C-20 alkyl," or "C-1 to C-20 fluoroalkyl," as non-limiting examples, this range encompasses linear alkyls, alkyloxy, fluoroalkyl and fluoroalkyloxy starting with C-1 but only designated branched alkyls, branched alkyloxy, cycloalkyl, cycloalkyloxy, branched fluoroalkyl, branched fluoroalkyloxy, cyclic fluoroalkyl and cyclic fluoroalkyloxy starting with C-3.

The term "alkylene" refers to hydrocarbon groups which can be a linear, branched or cyclic which has two or more attachment points (e.g., of two attachment points: methylene, ethylene, 1,2-isopropylene, a 1,4-cyclohexylene and the like; of three attachment points 1,1,1-substituted methane, 1,1,2-substituted ethane, 1,2,4-substituted cyclohexane and the like). Here again, when designating a possible range of carbons, such as C-1 to C-20, as a non-limiting example, this range encompasses linear alkylenes starting with C-1 but only designates branched alkylenes, or cycloalkylene starting with C-3. These alkylene moieties may be substituted or unsubstituted as described below.

The terms “mono and “oligomeric” alkyleneoxyalkylene” encompasses both simple alkyleneoxyalkylene moiety such as ethyleneoxyethylene (—$CH_2$—$CH_2$—O—$CH_2$—$CH_2$—), propyleneoxypropylene (—$CH_2$—$CH_2$—$CH_2$—O—$CH_2$—$CH_2$—$CH_2$—), and the like, and also oligomeric materials such as tri(ethyleneoxyethylene) (—$CH_2$—$CH_2$—O—$CH_2$—$CH_2$—O—$CH_2$—$CH_2$—), tri(propyleneoxypropylen), (—$CH_2$—$CH_2$—$CH_2$—O—$CH_2$—$CH_2$—$CH_2$—O—$CH_2$—$CH_2$—$CH_2$—), and the like.

The term “aryl” or “aromatic groups” refers to such groups which contain 6 to 24 carbon atoms including phenyl, tolyl, xylyl, naphthyl, anthracyl, biphenyls, bis-phenyls, tris-phenyls and the like. These aryl groups may further be substituted with any of the appropriate substituents, e.g., alkyl, alkoxy, acyl or aryl groups mentioned hereinabove.

The term “Novolak” if used herein without any other modifier of structure, refers to Novolak resins which are soluble in aqueous bases such as tetramethylammonium hydroxide and the like.

The term “arylene” refers to a aromatic hydrocarbon moiety which has two or more attachment points (e.g., 2-5), this moiety may be a single benzene moiety (e.g., two attachment points 1,4-phenylene, 1,3-phenylene and 1,2-phenylene; three attachment points 1,2,4-substituted benzene, 1,3,5-substituted benzene and the like), a polycyclic aromatic moiety with two attachment points such derived from naphthalene, anthracene, pyrene and the like, or a multiple benzene rings in a chain which have two attachment point (e.g., biphenylene). In those instances where the aromatic moiety is a fused aromatic ring, these may be called fused ring arylenes, and more specifically named, for instance, naphthalenylene, anthracenylene, pyrenylene, and the like. Fused ring arylenes may be substituted or unsubstituted as described below, additionally these fused ring arylenes may also contain a hydrocarbon substituent which has two attachment sites on the fused ring forming an additional aliphatic or unsaturated ring forming by attachment to the fused ring a ring having 5 to 10 carbon atoms.

The term “PAG,” unless otherwise described, refers to a photoacid generator that can generate acid (a.k.a. photoacid) under deep UV or UV irradiation such as 200-300 nm, i-line, h-line, g-line and/or broadband irradiation. The acid may be a sulfonic acid, HCl, HBr, $HAsF_6$, and the like.

The term “arene” encompasses aromatic hydrocarbon moieties comprising 1 ring or 2 to 8 carbon based aromatic rings fused together.

The term “heteroarene” refers to an arene which contains 1 or more trivalent or divalent heteroatoms respectively in such a way as to retain its aromaticity. Examples of such hetero atoms are N, O, P, and S. As non-limiting examples, such heteroarenes may contain from 1 to 3 such hetero atoms.

Unless otherwise indicated in the text, the term “substituted” when referring to an aryl, alkyl, alkyloxy, fluoroalkyl, fluoroalkyloxy, fused aromatic ring, arene, heteroarene refers to one of these moieties which also contain one or more substituents, selected from the group of unsubstituted alkyl, substituted alkyl, unsubstituted aryl, alkyloxyaryl (alkyl-O-aryl-), dialkyloxyaryl ((alkyl-O-)$_2$-aryl), haloaryl, alkyloxy, alkylaryl, haloalkyl, halide, hydroxyl, cyano, nitro, acetyl, alkylcarbonyl, formyl, ethenyl ($CH_2$=CH—), phenylethenyl (Ph-CH=CH—), arylethenyl (Aryl-CH=CH), and substituents comprising ethenylenearylene moieties (e.g., Ar(—CH=CH—Ar—)$_z$ where z is 1-3. Specific, non-limiting examples of substituted aryl and substituted aryl ethenyl substituents are as follows where “ ” represents the point of attachment:

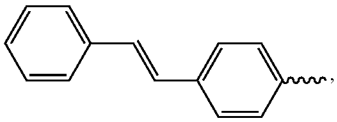,

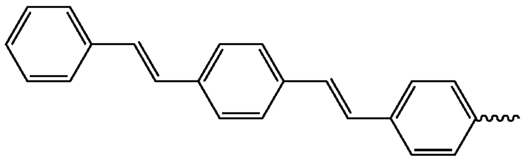 and

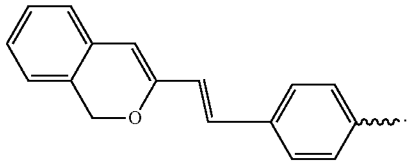.

Otherwise, substituted aryl, and substituted ethenyls, where the substituent is selected from any of the above substituents. Similarly, the term “unsubstituted” refers to these same moieties, wherein no substituents apart from hydrogen is present.

The terms “acid quencher” and/or “quencher system,” refers to one or more basic components, such as amines, which in a resist formulation could act to capture an acid generated by a photoacid generator during exposure to i-line or broadband radiation.

The term “solid components,” refers to components in a photoresist formulation which are not the solvent. Such components may be solids or liquids.

The term “phenolic resin component” includes all phenolic containing polymeric materials, including Novolak polymers/resins.

The term “acid cleavable acetal protecting group,” covers acetals which are cleavable by acid hydrolysis ($H^+$+$H_2O$ catalytic hydrolysis) in which an acetal group protecting a carboxylic acid is cleaved by hydrolytic cleavage allows a tertiary carbonium ion formed by acid cleavage to form an olefin regenerating the acid catalyst as follows, wherein Rac1 and Rac2 are alkyl groups and Rac3 is an alkyl group or H:

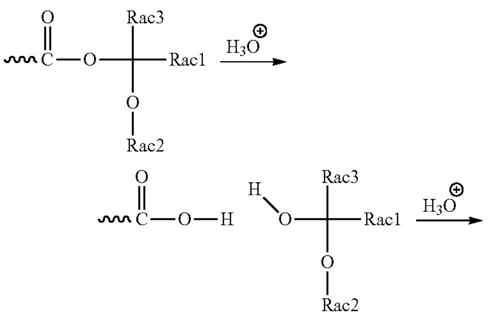

-continued

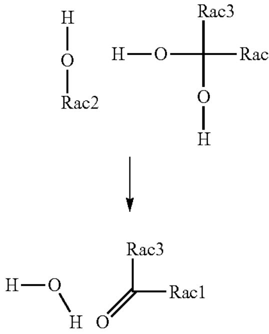

The term "tertiary alkyl acid cleavable group," covers tertiary alkyl esters which are cleavable by acidolysis ($H^+$ catalysis) in which the tertiary alkyl moiety (either branched, cyclic or alicyclic) has at least one hydrogen attached to a carbon attached to the tertiary carbon protecting a carboxylic acid; this allows a tertiary carbonium ion formed by acid cleavage freeing the carboxylic acid, to form an olefin regenerating the acid catalyst as follows:

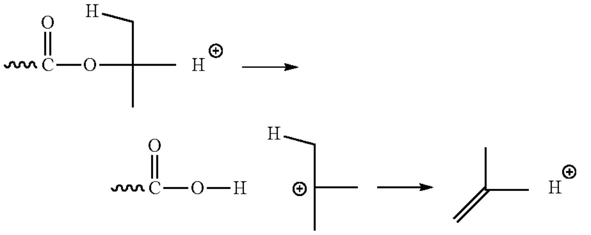

This tertiary alkyl group may be part of C-4 to C-8 non-cyclic alkyl group (e.g. tert-butyl, tert-amyl), a C6-C12 cyclic group (e.g. 1-methylcyclopentyl, 1-methylcyclohexyl) or a cyclic alkyl group.

Resist Compositions

The resist compositions disclosed and claimed herein are chemically amplified resist compositions that include:

(A) An acetal functionalized acrylic polymer component comprising repeat units selected from ones having structure (1), (2), (3), (4), (5), (6), and (7):

(1)

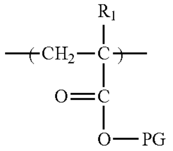

(2)

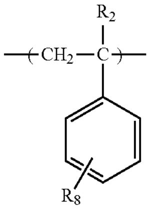

-continued (3)

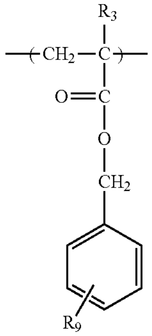

(4)

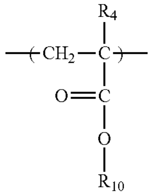

(5)

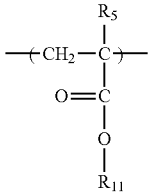

(6)

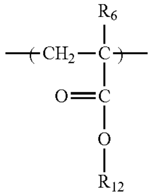

(7)

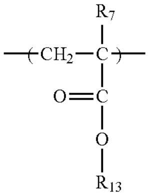, wherein PG is an acid cleavable acetal protecting group, wherein said repeat units constitute 100 mole % of the repeat unites in said acetal functionalized acrylic polymer, the repeat unit of structure (1) ranges from about 10 mole % to about 35 mole % of the acrylic polymer, the repeat unit of structure (2) ranges from about 0 mole % to about 20 mole % of the acrylic polymer, the repeat unit of structure (3) ranges from about 15 mole % to about 55 mole % of the acrylic polymer, the repeat unit of structure (4) ranges from about 0 mole % to about 30 mole % of the acrylic polymer, the repeat unit of structure (5) ranges from about 15 mole % to about 55 mole % of the acrylic polymer, the repeat unit of structure (6) ranges from about 0 mole % to about 40 mole % of the acrylic polymer, the repeat unit of structure (7) ranges from about 0 mole % to about 25 mole % of the acrylic polymer, $R_1$, $R_2$, $R_3$, $R_4$, $R_5$, $R_6$, and $R_7$ are individually selected from either H, F, a C-1 to C-4 perfluoroalkyl, or a C-1 to C-4 alkyl, $R_8$ and $R_9$ are individually selected from H, a C-1 to C-4 alkyl, a C-1 to C-4 alkyloxy alkyl, and a halogen, $R_{10}$ is selected from the group consisting of a C-1 to C-8 primary alkyl, a C-3 to C-8 secondary alkyl, a C-3 to C-8 cyclic secondary alkyl, and a C-7 to C-14 alicyclic secondary alkyl, $R_{11}$ is a C-2 to C-8 (hydroxy)alkylene moiety, $R_{12}$ is a tertiary alkyl acid cleavable group, and $R_{13}$ is a C-3 to C-12, (alkyloxy)alkylene moiety and preferably wherein the acrylic polymer comprises about 0.5 wt % solids to about 70 wt % solids;

(B) A tert-alkyl functionalized acrylic polymer component comprising repeat units selected from ones having structure (1a), (2a), (3a), (4a), (5a), (6a), and (7a):

(1a)

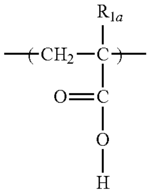

(2a)

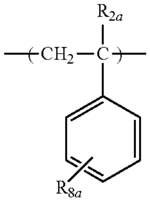

(3a)

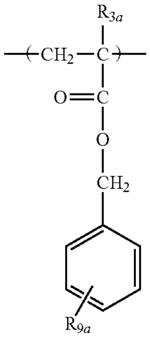

(4a)

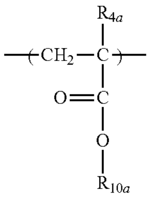

(5a)

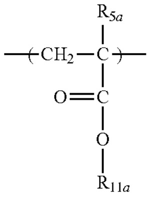

-continued (6a)

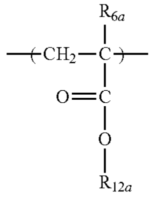

(7a)

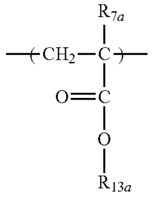

, wherein said repeat units constitute 100 mole % of the repeat units in said tert-alkyl functionalized acrylic polymer, the repeat unit of structure (1a) ranges from about 0 mole % to about 15 mole % of the acrylic polymer, the repeat unit of structure (2a) ranges from about 0 mole % to about 20 mole % of the acrylic polymer, wherein the repeat unit of structure (3a) ranges from about 0 mole % to about 30 mole % of the acrylic polymer, wherein the repeat unit of structure (4a) ranges from about 0 mole % to about 30 mole % of the acrylic polymer, wherein the repeat unit of structure (5a) ranges from about 15 mole % to about 40 mole % of the acrylic polymer, the repeat unit of structure (6a) ranges from about 30 mole % to about 45 mole % of the acrylic polymer, the repeat unit of structure (7a) ranges from about 0 mole % to about 20 mole % of the acrylic polymer, $R_{1a}$, $R_{2a}$, $R_{3a}$, $R_{4a}$, $R_{5a}$, $R_{6a}$, and $R_{7a}$ are individually selected from either H, F, a C-1 to C-4 perfluoroalkyl, or a C-1 to C-4 alkyl, $R_{8a}$ and $R_{9a}$ are individually selected from H, a C-1 to C-4 alkyl, a C-1 to C-4 alkyloxy alkyl, and a halogen, $R_{10a}$ is selected from the group consisting of a C-1 to C-8 primary alkyl, a C-3 to C-8 secondary alkyl, a C-3 to C-8 cyclic secondary alkyl, and a C-7 to C-14 secondary alicyclic alkyl, $R_{11a}$ is a C-2 to C-8 (hydroxy)alkylene moiety, and $R_{12a}$ is a tertiary alkyl acid cleavable group.

$R_{13a}$ is a C-3 to C-12, (alkyloxy)alkylene moiety;

(C) A phenolic resin component comprising a Novolak-based resin;

(D) A photo acid generator (PAG) component; and (E) A solvent component.

And further wherein, the resist compositions do not include a diazonaphthoquinone (DNQ) component.

The above resists composition can further include one or more optional components such as, but not limited to, acid quenchers, auxiliary resins, thiols, plasticizers, surface leveling agents and stabilizers.

In a further embodiment, the resist compositions disclosed and claimed herein consist essentially of the forgoing ingredients in varying concentrations without the presence of an added DNQ. In such an embodiment, the combined amounts of the ingredients do not equal 100% by weight and can include other ingredients that do not materially change the effectiveness of the resist composition.

In a still further embodiment, the resist compositions disclosed and claimed herein consist of ingredients (A), (B), (C), (D), and (E) in varying concentrations. In such an embodiment, the combined amounts of ingredients (A), (B), (C), (D), and (E) equal approximately 100% by weight but may include other small and/or trace amounts of impurities that are present in such small quantities that they do not materially change the effectiveness of the resist composition.

Notably, the resist compositions disclosed and claimed herein do not require or include any kind of diazonaphthoquinone (DNQ) components for example DNQ photoactive dissolution inhibitor compound, or a DNQ compound which acts as both a photoactive dissolution inhibitor compound and also act as a source of sulfonic photoacid that can deprotect acid labile groups on the acrylate polymer components (A) or (B).

Component (A)

In one embodiment of the above composition, component (A), the acetal functionalized acrylic polymer component comprises, from about 15 mole % to about 35 mole % of the repeat unit of structure (1), from about 15 mole % to about 45 mole % of the repeat unit of structure (3), from about 15 mole % to about 35 mole % of the repeat unit of structure (5), from about 10 mole % to about 25 mole % of the repeat unit of structure (7), wherein these repeat units constitute 100 mole % of the repeat units in said acetal functionalized acrylic polymer. In another aspect of this embodiment, the repeat unit of structure (1) has structure (1b), wherein $R_{1b}$ is H or $CH_3$; the repeat unit of structure (3) has structure (3b); the repeat unit of structure (5) has structure (5b), the repeat unit of structure (7) has structure (7b), and further wherein these repeat units constitute 100 mole % of the acetal functionalized acrylic polymer.

(1b)

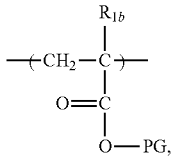

(3b)

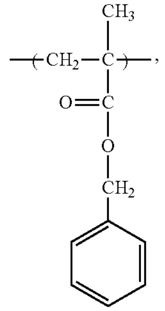

(5b)

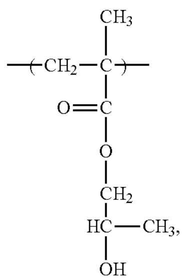

-continued (7b)

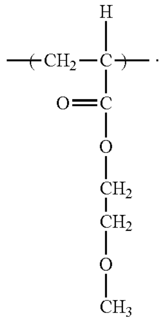

In another embodiment of the above composition component (A) the acetal functionalized polymer component comprises from about 15 mole % to about 20 mole % of the repeat unit of structure (1), from about 5 mole % to about 25 mole % of the repeat unit of structure (2), from about 15 mole % to about 35 mole % of the repeat unit of structure (5), from about 10 mole % to about 40 mole % of the repeat unit of structure (6), wherein these repeat units constitute 100 mole % of the repeat units in said acetal functionalized acrylic polymer. In another aspect of this embodiment, the repeat unit of structure (1) has structure (1b), wherein $R_{1b}$ is H or $CH_3$; the repeat unit of structure (2) has structure (2b); the repeat unit of structure (5) has structure (5b); the repeat unit of structure (6) has structure (6b), or (6c) wherein $R_{1c}$ is H or $CH_3$, and further wherein these repeat units constitute 100 mole % of the repeat units in said acetal functionalized acrylic polymer. In a further aspect of this embodiment the repeat unit of structure (6) has structure (6b), in still another aspect the repeat unit of structure (6) has structure (6c). In still another aspect of this embodiment, the repeat unit of structure (6) has structure (6d). In still another aspect of this embodiment, the repeat unit of structure (6) has structure (6e). In still another aspect of this embodiment, the repeat unit of structure (6) has structure (6f). In still another aspect of this embodiment, the repeat unit of structure (6) has structure (6g):

(1b)

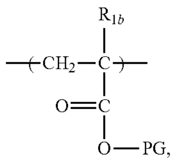

(2b)

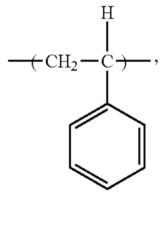

-continued (5b)

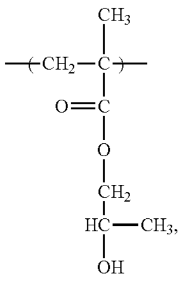

(6b)

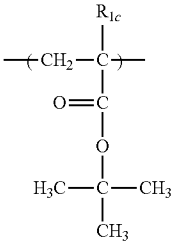

(6c)

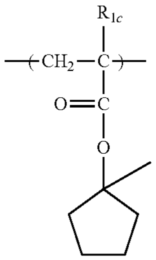

(6d)

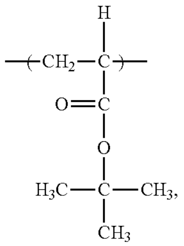

(6e)

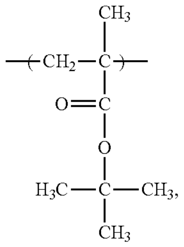

(6f)

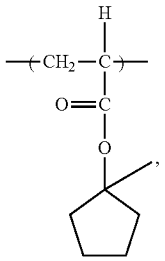

-continued (6g)

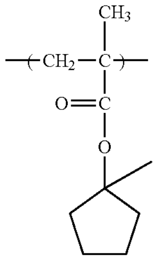

In another embodiment of the above composition component (A), the acetal functionalized acrylic polymer component comprises from about 20 mole % to about 35 mole % of the repeat unit of structure (1), from about 15 mole % to about 50 mole % of the repeat unit of structure (3), from about 15 mole % to about 30 mole % of the repeat unit of structure (5), from about 10 mole % to about 35 mole % of the repeat unit of structure (7), wherein these repeat units constitute 100 mole % of the repeat units in said acetal functionalized acrylic polymer. In another aspect of this embodiment, the repeat unit of structure (1) has structure (I b) wherein Rib is H or $CH_3$; the repeat unit of structure (3) has structure (3b), the repeat unit of structure (4) has structure (4b), or (4c) the repeat unit of structure (5) has structure (5b). In another aspect of this embodiment the repeat unit of structure (4) has structure (4b). In another aspect of this embodiment the repeat unit of structure (4) has structure (4c):

(1b)

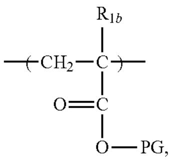

(3b)

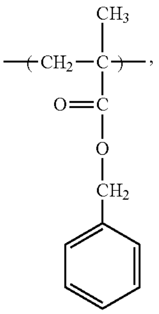

(4b)

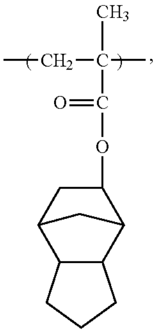

-continued (4c)

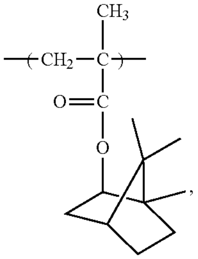

(5b)

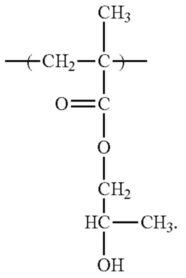

In another embodiment of the above composition, component (A), the acetal functionalized polymer component, the moiety PG the acid cleavable acetal protecting group may have the general structure (AC), wherein Rac1 is selected from a C-1 to C-8 unsubstituted primary alkyl, an unsubstituted C-3 to C-8 branched secondary alkyl, an unsubstituted C-3 to C-8 cyclic secondary alkyl, and an unsubstituted C-7 to C-14 secondary alicyclic alkyl, Rac2 is selected from an unsubstituted C-1 to C-8 primary alkyl, an halogen substituted C-1 to C-8 primary alkyl, an unsubstituted C-3 to C-8 branched secondary alkyl, a halogen substituted C-3 to C-8 branched secondary alkyl, an unsubstituted C-3 to C-8 cyclic secondary alkyl, an unsubstituted C-7 to C-14 secondary alicyclic alkyl, and a halogen substituted C-7 to C-14 secondary alicyclic alkyl, and Rac3 is selected from H, an unsubstituted C-1 to C-8 primary alkyl, an unsubstituted C-3 to C-8 branched secondary alkyl, an unsubstituted C-3 to C-8 cyclic secondary alkyl, and an unsubstituted C-7 to C-14 secondary alicyclic alkyl. In another aspect of this embodiment Rac3 is selected from H, an unsubstituted C-1 to C-8 primary alkyl, an unsubstituted C-3 to C-8 branched secondary alkyl, an unsubstituted C-3 to C-8 cyclic secondary alkyl, and an unsubstituted C-7 to C-14 secondary alicyclic alkyl. In one specific aspect of this embodiment Rac1 is an unsubstituted C-1 to C-8 primary alkyl, Rac2 is an unsubstituted C-1 to C-8 primary alkyl and Rac3 is H. In another specific aspect of this embodiment Rac1 is an unsubstituted C-1 to C-8 primary alkyl, Rac2 is a halogen substituted C-1 to C-8 primary alkyl and Rac3 is H. In another more specific aspect of this embodiment Rac1 is $CH_3$, and Rac2 is an unsubstituted C-1 to C-8 primary alkyl, and Rac3 is H. In yet another more specific aspect of this embodiment Rac1 is $CH_3$, and Rac2 is a halogen substituted C-1 to C-8 primary alkyl, and Rac3 is H:

(AC)

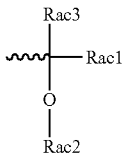

In another embodiment of the above composition, component (A) is one wherein the repeat unit of structure (1) has specific structures. In one such embodiment it has structure (1c). In yet another aspect it has structure (id). In still another aspect, it has structure (1e). In yet another aspect it has structure (if).

(1c)

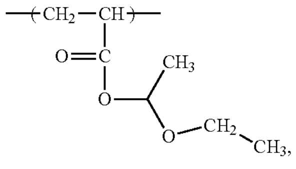

(1d)

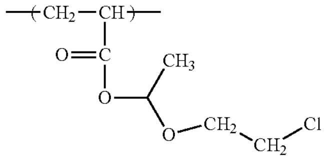

(1e)

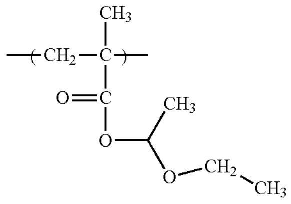

(1f)

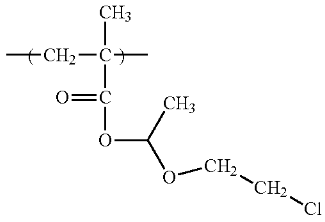

Component (B)

In another embodiment of the above composition, component (B), the tert-alkyl functionalized acrylic polymer component comprises from about 2 mole % to about 15 mole % of the repeat unit of structure (1a), from about 10 mole % to about 25 mole % of the repeat unit of structure (3a), from about 15 mole % to about 30 mole % of the repeat unit of structure (5a), from about 30 mole % to about 45 mole % of the repeat unit of structure (6a), from about 2 mole % to about 15 mole % of the repeat unit of structure (7a), wherein these repeat units constitute 100 mole % of the repeat units in said tert-alkyl functionalized acrylic polymer. In a more specific aspect of this embodiment the repeat unit of structure (1a) has structure (1e), wherein $R_{1a}$ is H or $CH_3$; the repeat unit of structure (3a) has structure (3b); the repeat unit of structure (5a) has structure (5b); the repeat unit of structure (6a) has structure (6b) or (6c) wherein $R_{1c}$ is H or $CH_3$ the repeat unit of structure (7a) has structure (7b).

(1e)

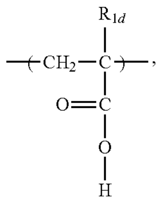

(3b)

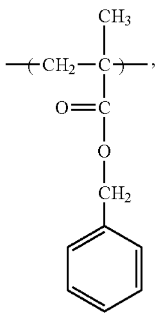

(5b)

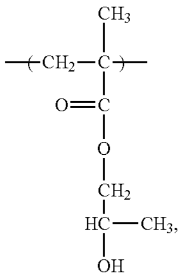

(6b)

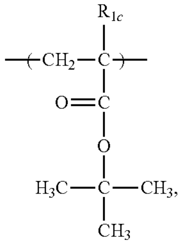

(6c)

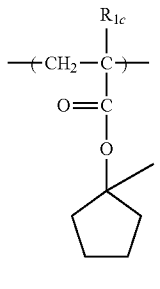

-continued (7b)

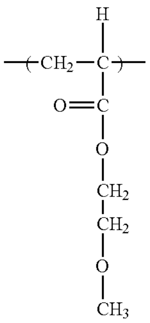

In another embodiment of the above composition, component (B), the tert-alkyl functionalized acrylic polymer component, comprises from about 2 mole % to about 15 mole % of the repeat unit of structure (1a), from about 10 mole % to about 25 mole % of the repeat unit of structure (3a), from about 10 mole % to about 25 mole % of the repeat unit of structure (4a), from about 25 mole % to about 35 mole % of the repeat unit of structure (5a), from about 30 mole % to about 45 mole % of the repeat unit of structure (6a), wherein these repeat units constitute 100 mole % of the repeat units in said tert-alkyl functionalized acrylic polymer. In a more specific aspect of this embodiment the repeat unit of structure (1a) has structure (1 e) wherein $R_{1a}$ is H or $CH_3$; the repeat unit of structure (3a) has structure (3c); the repeat unit of structure (4a) has structure (4c) or (4b); the repeat unit of structure (5a) has structure (5b); and the repeat unit of structure (6a) has structure (6b) or (6c), wherein $R_{1c}$ is H or $CH_3$:

(1e)

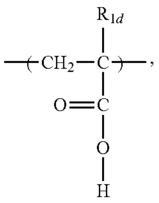

(3c)

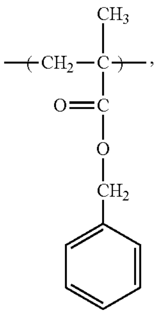

(4c)

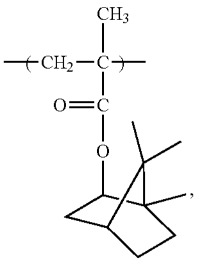

-continued (4b)

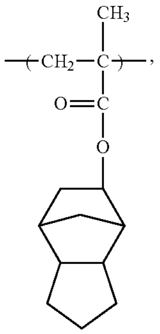

(5b)

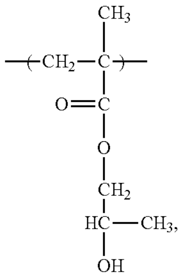

(6b)

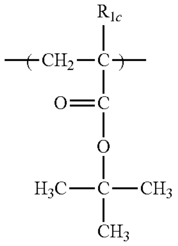

(6c)

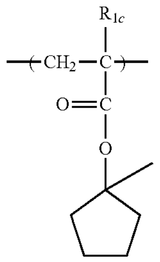

In another embodiment of the above composition, component (B), the tert-alkyl functionalized acrylic polymer component, comprises from about 5 mole % to about 10 mole % of the repeat unit of structure (1a), from about 10 mole % to about 25 mole % of the repeat unit of structure (3a), from about 25 mole % to about 35 mole % of the repeat unit of structure (5a), from about 35 mole % to about 45 mole % of the repeat unit of structure (6a), wherein these repeat units constitute 100 mole % of the repeat units in said tert alkyl functionalized acrylic polymer. In a more specific aspect of this embodiment the repeat unit of structure (1 a) has structure (1 e), wherein $R_{1d}$ is H or $CH_3$; the repeat unit of structure (3a) has structure (3b); the repeat unit of structure (5a) has structure (5b); the repeat unit of structure (6a) has structure (6b) or (6c) wherein $R_{1c}$ is H or $CH_3$:

(1e)

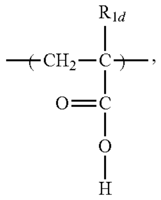

(3b)

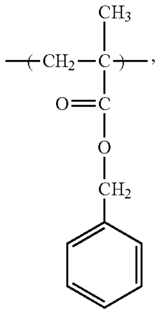

(5b)

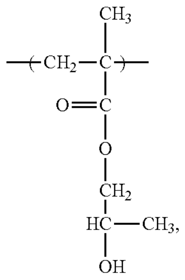

(6b)

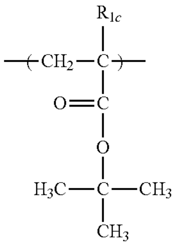

(6c)

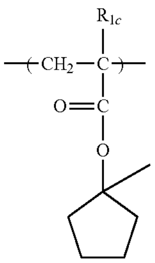

In another embodiment of the above composition, component (B), described above, the tert-alkyl functionalized acrylic polymer component is one wherein the repeat of structure (1a) or (1e) is one that has structure (1g) and preferably it comprises from about 5 mole % to about 10 mole % of this component total:

(1g)

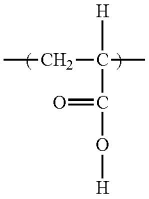

In another embodiment of the above composition, component (B), described above, the tert-alkyl functionalized acrylic polymer component is one wherein the repeat of structure (1a) or (1 e) is one that has structure (1h) and preferably it comprises from about 5 mole % to about 10 mole % of this component total:

(1h)

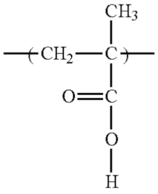

In another embodiment of the above composition, component (B), the tert-alkyl functionalized acrylic polymer component, comprises from about 10 mole % to about 25 mole % of the repeat unit of structure (3a), from about 25 mole % to about 35 mole % of the repeat unit of structure (5a), from about 30 mole % to about 45 mole % of the repeat unit of structure (6a), from about 8 mole % to about 15 mole % of the repeat unit of structure (7a), wherein these repeat units constitute 100 mole % of the repeat units in said tert-alkyl functionalized acrylic polymer. In a more specific aspect of this embodiment the repeat unit of structure (3a) has structure (3c); the repeat unit of structure (5a) has structure (5c); the repeat unit of structure (6a) has structure (6b) or (6c), wherein $R_{1c}$ is H or $CH_3$; the repeat unit of structure (7a) has structure (7c). In another aspect of this embodiment the repeat unit of structure (6a) has structure (6c). In yet another aspect of this embodiment the repeat unit of structure (6a) has structure (6d). In another aspect of this embodiment the repeat unit of structure (6a) has structure (6f). In another aspect of this embodiment the repeat unit of structure (6a) has structure (6g).

(3c)

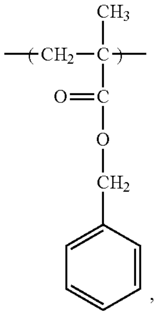
,

-continued (5c)

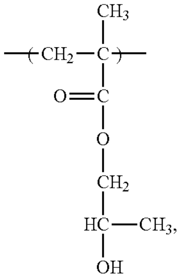

(6b)

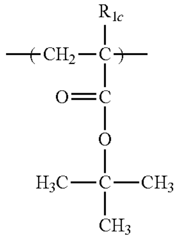

(6c)

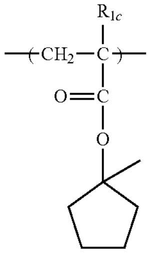

(7c)

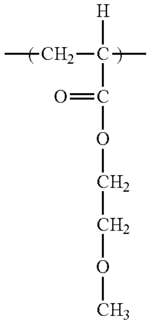

(6c)

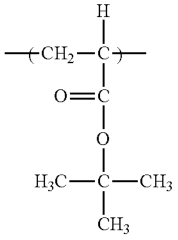

(6d)

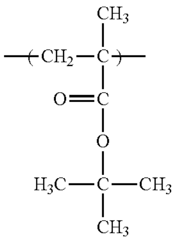

-continued (6f)

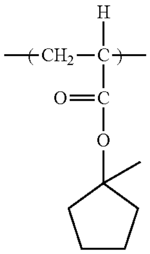

(6g)

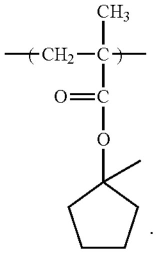

In another embodiment of the above composition, component (A) the acetal functionalized polymer component and component (B), the tert-alkyl functionalized acrylic polymer component, are present in a wt. ratio of (A)/(B) which ranges from about 10 to about 2.3.

In another embodiment of the above composition, component (A) the acetal functionalized polymer component and component (B), the tert-alkyl functionalized acrylic polymer component, are present in a wt. ratio of (A)/(B) which ranges from about 9 to about 2.3.

In another embodiment of the above composition, component (A) the acetal functionalized polymer component and component (B), the tert-alkyl functionalized acrylic polymer component, are present in a wt. ratio of (A)/(B) which ranges from about 9 to about 3.

In another embodiment of the above composition, component (A) the acetal functionalized polymer component and component (B), the tert-alkyl functionalized acrylic polymer component are present in a wt. ratio of (A)/(B) which ranges from about 8 to about 3.5.

In another embodiment of the above composition it is one wherein (A) the acetal functionalized polymer component and (B) the tert-alkyl functionalized acrylic polymer component are present in a wt. ratio of (A)/(B) which ranges from about 7 to about 4.

Component (C)

In another embodiment of the above composition, component (C) the Novolak-based resin component comprises repeat unit of structure (I); where Ra1, Ra2 and Ra3 are each independently (i) a hydrogen, (ii) an unsubstituted C-1 to C-4 alkyl, (iii) a substituted C-1 to C-4 alkyl, (iv) an unsubstituted —X-Phenol group where X is —O—, —$C(CH_3)_2$—, —$CH_2$—, —(C═O)— or —$SO_2$— or (v) a substituted —X-Phenol group where X is —O—, —C$(CH_3)_2$—, —$CH_2$—, —(C═O)— or —$SO_2$—. In a more specific aspect of this embodiment Ra1 and Ra2 are each hydrogen and Ra3 is an unsubstituted C-1 to C-4 alkyl. In yet another more specific aspect of this embodiment Ra1 and Ra2 are each hydrogen and Ra3 is —$CH_3$. In another aspect of this embodiment it is on wherein Ra1 and Ra2 are each hydrogen and Ra3 is —$CH_3$.

(I)

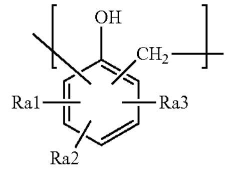

In another aspect of the above composition embodiments wherein, component (C) is Novolak-based resin component comprises repeat unit of structure (I) having the structure (IA):

(IA)

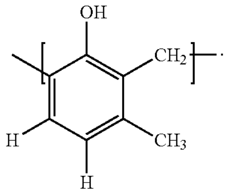

In another aspect of the of the above composition embodiments wherein, component (C) is Novolak-based resin component comprises repeat unit of structure (I) or it has the more specific structure (IA) it is one wherein said Novolak-based resin component further comprises one or more of repeat units of structure (11), where (i) Ra1, Ra2 and Ra3 are each independently a hydrogen, an unsubstituted C-1 to C-4 alkyl or a substituted C-1 to C-4 alkyl, (ii) X is —O—, —$C(CH_3)_2$—, —$CH_2$—, (C═O)—, or —$SO_2$— and (iii) each Ra4 is independently a hydrogen, an unsubstituted C-1 to C-4 alkyl or a substituted C-1 to C-4 alkyl. In another aspect of this embodiment it is one wherein said Novolak-based resin component further comprises a repeat unit of structure (II) this repeat one is one with the more specific structure (IIA):

(II)

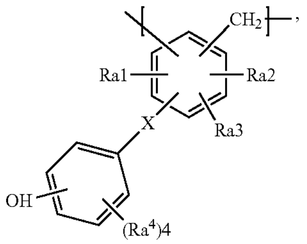

(IIA)

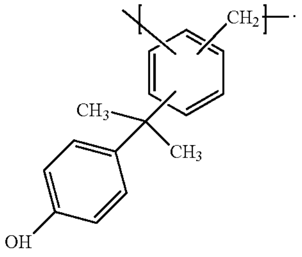

Component (D)

Component (D) the PAG component can be any PAG component known to those skilled in the art including, but not limited to, aromatic imide N-oxysulfonate derivatives of an organic sulfonic acid, an aromatic sulfonium salts of an organic sulfonic acid and trihalotriazine derivatives, or mixtures thereof.

For example, the PAG component may be one which generates, upon 365 nm and/or broadband irradiation, a photoacid such as a sulfonic acid, such as alkylsulfonic acid, aryl sulfonic acid or fluoroalkylsulfonic acid, perfluorosulfonic acid, inorganic acid such as $HAsF_6$, $HSbF_6$, $HPF_6$, or acid derived from tetra(perfluorophenyl)borates, H(perf-Ph)$_4$B, or similar tetra(perfluoroaryl)borates, H(perf-Aryl)$_4$B. Non limiting examples of such PAG's are such photoacid generator include a variety of photoacid generators, such as onium salts, dicarboximidyl sulfonate esters, oxime sulfonate esters, diazo(sulfonyl methyl) compounds, disulfonyl methylene hydrazine compounds, nitrobenzyl sulfonate esters, biimidazole compounds, diazomethane derivatives, glyoxime derivatives, β-ketosulfone derivatives, disulfone derivatives, sulfonic acid ester derivatives, imidoyl sulfonate derivatives, diazonaphthoquinone sulfonate esters or combinations thereof. Such photoacid generators may inherently be sensitive to 365 nm and/or broadband radiation by appropriate substitution as known in the art. More specifically, these may, for instance, as non-limiting examples, be substituted or unsubstituted triarylsulfonium salt of an organic sulfonic acids, wherein in the triarylsulfonium moiety or its corresponding acid anion contains at least one aryl moiety which has a conjugated aryl, wherein the conjugated aryl moiety is either selected from a phenyl ring with at least one substituent selected from the aryloxy, alkyloxy, nitro, cyano, acetyl, aryl, alkenyl, alkyloxyaryl (alkyl-O-aryl-), dialkyloxyaryl ((alkyl-O-)$_2$-aryl), or wherein the conjugated aryl moiety, alternatively, is a substituted or unsubstituted fused aromatic ring moiety comprising 2 to 4 rings. Such substituents may be attached through a difunctional moiety capable of undergoing a resonance delocalization, such as arylene, including arylenes derived from a fused aromatic, or for example ethenylene (—C═C—) moieties. ethenyl ($CH_2$═CH—), phenylethenyl (Ph-CH═CH—), arylethenyl (Aryl-CH═CH—), and substituents comprising ethenylenearylene moieties (e.g., Ar(—CH═CH—Ar—)$_z$ where z is 1-3).

Specific, non-limiting examples of substituted aryl and substituted aryl ethenyl substituents include:

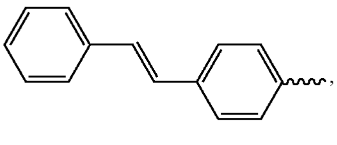,

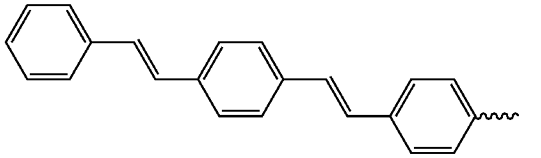 and

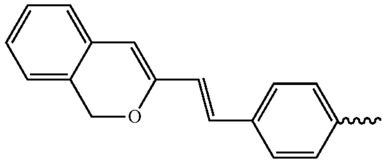

where  represents the point of attachment.

Other examples of common PAG's sensitive to 365 nm and/or broadband radiation are substituted or unsubstituted 1,3-dioxo-1H-benzo[de]isoquinolin-2(3H)-yl ester organic sulfonic acids. These PAG's may also have substituents as described above. One example is 1,3-dioxo-1H-benzo[de]isoquinolin-2(3H)-yl trifluoromethanesulfonate [also called naphthalene dicarboximidyl triflate, NIT] (NIT PAG).

In another aspect of this novel composition said PAG component may be one wherein the photoacid generator itself, is not directly sensitive to i-line or broadband radiation, but which has been sensitized to this radiation with photosensitizers that extend the effective wavelength and/or energy range. Such photosensitizers may be, without limitation, substituted and unsubstituted anthracenes, substituted and unsubstituted phenothiazines, substituted and unsubstituted perylenes, substituted and unsubstituted pyrenes, and aromatic carbonyl compounds, such as benzophenone and thioxanthone, fluorene, carbazole, indole, benzocarbazole, acridone chlorpromazine, equivalents thereof or combinations of any of the foregoing.

In other embodiment of this invention, said PAG component may be a trihalomethyl derivative, and it may be one which contains 1 to 3 trihalomethyl substituents. In another embodiment of this aspect of the invention, the trihalomethyl derivative is an arene or substituted arene comprising from 1 to 3 trihalomethyl substituents. In another aspect of this embodiment said trihalomethyl derivative may be one which contains 1 to 3 trihalomethyl substituents which are attached to said arene or substituted arene moiety through a sulfone spacer (—$SO_2$—).

In another embodiment of this invention, wherein said PAG component is a trihalomethyl it may be one of a heteroarene or substituted heteroarene comprising 1 to 3 trihalomethyl moieties.

In another embodiment of this invention, wherein said PAG component is a trihalomethyl, it may be a derivative of an heteroarene or substituted heteroarene comprising from 1 to 3 trihalomethyl substituents which are attached to said heteroarene or substituted heteroarene through a sulfone spacer (—$SO_2$—).

In another embodiment of the above composition, component (D) said photo acid generator (PAG) component it is an aromatic imide N-oxysulfonate derivatives of an organic sulfonic acid, an aromatic sulfonium salt of an organic sulfonic acid, a trihalotriazine derivative or a mixture thereof. In a more specific aspect of this embodiment said photo acid generator (PAG) component is one or more of compounds having:

(i) structure (IXa), wherein $R_{1p}$ is a fluoroalkyl moiety and $R_{2p}$ is H, an alkyl, an oxyalkyl, a thioalkyl, or an aryl moiety;

(IXa)

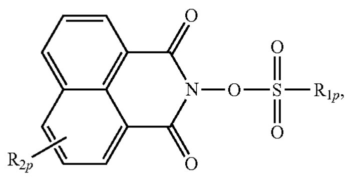

(ii) structure (IXb), wherein $R_{3p}$ is a fluoroalkyl, an alkyl or an aryl moiety and $R_{4p}$ is H, an alkyl, an oxyalkyl, a thioalkyl, or an aryl moiety:

(IXb)

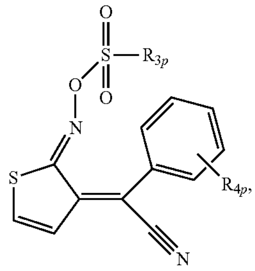

(iii) structure (IXc), wherein X is Cl or Br, $R_{5p}$ is an aryl or an alkyl moiety and n is 0 or 1:

(IXc)

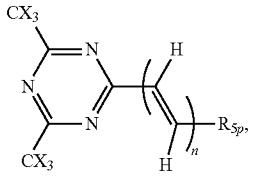

(iv) structure (IXd), wherein $R_{6p}$ is a substituted or unsubstituted alkenyl or substituted or unsubstituted aryl group, or a substituted or unsubstituted fused aromatic ring moiety including 2 to 4 rings, Y is oxygen or nitrogen and X is Cl or Br:

(IXd)

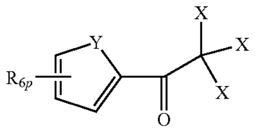

(v) structure (IXe), wherein $R_{7p}$ is a substituted or unsubstituted alkenyl or substituted or unsubstituted aryl group and X is Cl or Br:

(IXe)

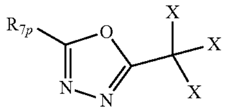

(vi) structure (IXf), wherein X is Br or Cl and $R_{8p}$ is an unsubstituted or substituted alkenyl, an unsubstituted aryl, a substituted aryl moiety or a substituted or unsubstituted fused aromatic ring moiety including 2 to 4 rings:

(IXf)

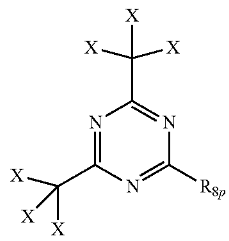

(vii) structure (IXg), wherein $R_{9p}$ is an unsubstituted or substituted alkenyl or an unsubstituted aryl or substituted aryl moiety.

(IXg)

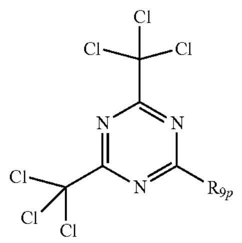

In another embodiment of the above composition, component (C) is one wherein the photo acid generator (PAG) component comprises 1,3-dioxo-1H-benzo[de]isoquinolin-2(3H)-yl trifluoromethanesulfonate (NIT PAG).

Component (E)

In another embodiment of the above composition, component (E), the solvent component, comprises one or more of butyl acetate, amyl acetate, cyclohexyl acetate, 3-methoxybutyl acetate, methyl ethyl ketone, methyl amyl ketone, cyclohexanone, cyclopentanone, ethyl-3-ethoxy propanoate, methyl-3-ethoxy propanoate, methyl-3-methoxy propanoate, methyl acetoacetate, ethyl acetoacetate, diacetone alcohol, methyl pivalate, ethyl pivalate, propylene glycol monomethyl ether (PGME), propylene glycol monoethyl ether, propylene glycol monomethyl ether propanoate, propylene glycol monoethyl ether propanoate, ethylene glycol monomethyl ether, ethylene glycol monoethyl ether, diethylene glycol monomethyl ether, diethylene glycol monoethyl ether, 3-methyl-3-methoxybutanol, N-methylpyrrolidone, dimethyl sulfoxide, gamma-butyrolactone, propylene glycol methyl ether acetate (PGMEA), propylene glycol ethyl ether acetate, propylene glycol propyl ether acetate, methyl lactate, ethyl lactate, propyl lactate, tetramethylene sulfone, propylene glycol dimethyl ether, dipropylene glycol dimethyl ether, ethylene glycol dimethyl ether or diethylene glycol dimethyl ether and gamma butyrolactone. In one aspect of this embodiment the solvent component comprises propylene glycol monomethyl ether (PGME). In another aspect of this embodiment the solvent component comprises propylene glycol monomethyl ether acetate (PGMEA).

Optional Components

In another embodiment of the composition, described herein, it further comprising one or more optional ingredients selected from among an acid quencher, an auxiliary resin, a thiol, which is preferably a heterocyclic thiol, a plasticizer, a surface leveling agent and a stabilizer.

Heterocylic Thiols

In one embodiment of the above described inventive compositions it further comprises at least one optional heterocyclic thiol component. In one aspect of this embodiment said heterocyclic thiol component is at least one heterocyclic thiol compound comprising a ring structure chosen from the general structures (H1), (H2) or (H3), or tautomers thereof; and (H1)

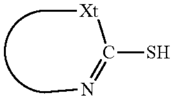

(H2)

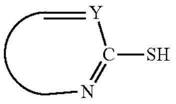

(H3)

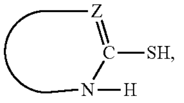

wherein, said ring structure is a single ring structure having from 4 to 8 atoms, or a multi ring structure having from 5 to 20 atoms; and wherein the single ring structure, or the multi ring structure comprises an aromatic, non-aromatic, or heteroaromatic ring, and in said structure (H1), Xt is selected from the group consisting of $C(Rt_1)(Rt_2)$, O, S, Se, and Te;

in said structure (H2), Y is selected from the group consisting of $C(Rt_3)$ and N;

in said structure (H3), Z is selected from the group consisting of $C(Rt_3)$ and N; and $Rt_1$, $Rt_2$, and $Rt_3$ are independently selected from the group consisting of H, a substituted alkyl group having 1 to 8 carbon atoms, an unsubstituted alkyl group having 1 to 8 carbon atoms, a substituted alkenyl group having 2 to 8 carbon atoms, unsubstituted alkenyl group having 2 to 8 carbon atoms, a substituted alkynyl group having 2 to 8 carbon atoms, unsubstituted alkynyl group having 2 to 8 carbon atoms, a substituted aromatic group having 6 to 20 carbon atoms, a substituted heteroaromatic group having 3 to 20 carbon atoms, unsubstituted aromatic group having 6 to 20 carbon atoms and unsubstituted heteroaromatic group having 3 to 20 carbon atoms.

In another embodiment wherein said inventive composition comprises at least one heterocyclic thiol chosen from the above general structures (H1), (112) or (H3), or tautomers thereof these may be chosen without limitation from substituted or unsubstituted triazole thiols, substituted or unsubstituted imidazole thiols, substituted or unsubstituted triazine thiols, substituted or unsubstituted mercapto pyrimidines, substituted or unsubstituted thiadiazole-thiols, substituted or unsubstituted indazole thiols, tautomers thereof or combinations thereof. Substituents may include, without limitation, saturated or unsaturated hydrocarbon groups, substituted or unsubstituted aromatic rings, aliphatic, aromatic or heteroaromatic alcohols, amines, amides, imides carboxylic acids, esters, ethers, halides, and the like. Such substituents may be used in concert with the heterocyclic thiol to improve solubility, to modify interaction with the substrate, to enhance exposure to light or to act as an antihalation dye.

In another embodiment wherein said inventive composition comprises at least one heterocyclic thiol chosen from the above general structures (H1), (H2) or (H3), or tautomers thereof such heterocyclic thiols may be chosen, without limitation from the following compounds (H4) to (H34) in unsubstituted or substituted form:

(H4)

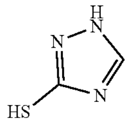

1H-1,2,4-triazole-3-thiol (H5)

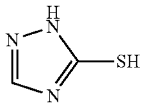

1H-1,2,4-triazole-5-thiol (H6)

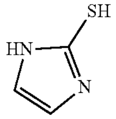

1H-imidazole-2-thiol (H7)

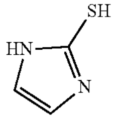

1H-imidazole-2-thiol (H8)

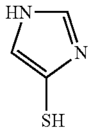

1H-imidazole-4-thiol (H9)

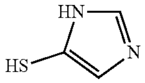

1H-imidazole-5-thiol (H10)

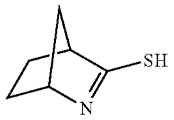

2-azabicyclo[2.2.1]hept-2-ene-3-thiol (H11)

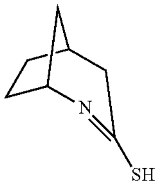

2-azabicyclo[3.2.1]oct-2-ene-3-thiol

-continued (H12)

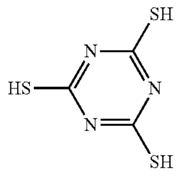

1,3,5-triazine-2,4,6-trithiol (H13)

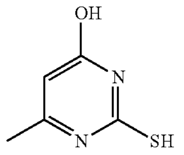

2-mercapto-6-methylpyrimidin-4-ol (H14)

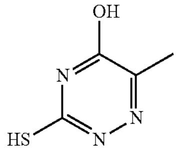

3-mercapto-6-methyl-1,2,4-triazin-5-ol (H15)

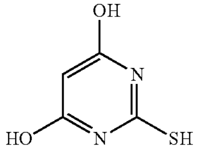

2-mercaptopyrimidine-4,6-diol (H16)

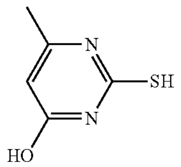

2-mercapto-6-methylpyrimidin-4-ol (H17)

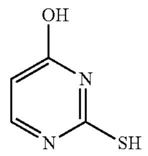

2-mercaptopyrimidin-4-ol (H19)

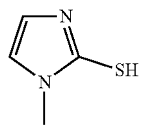

1-methyl-1H-imidazole-2-thiol (H20)

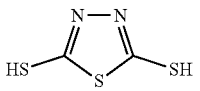

1,3,4-thiadiazole-2,5-dithiol

-continued (H21)

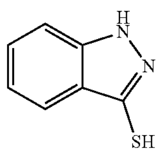

1H-indazole-3-thiol

In another embodiment wherein said inventive composition comprises at least one heterocyclic thiol chosen from the above general structures (H1), (H2) or (H3), or tautomers thereof such heterocyclic thiols may be chosen from thiouracil derivatives such as 2-thiouracil are further examples. These include, without limitation, 5-methyl-2-thiouracil, 5,6-dimethyl-2-thiouracil, 6-ethyl-5-methyl-2-thiouracil, 6-methyl-5-n-propyl-2-thiouracil, 5-ethyl-2-thiouracil, 5-n-propyl-2-thiouracil, 5-n-butyl-2-thiouracil, 5-n-hexyl-2-thiouracil, 5-n-butyl-6-ethyl-2-thiouracil, 5-hydroxy-2-thiouracil, 5,6-dihydroxy-2-thiouracil, 5-hydroxy-6-n-propyl-2-thiouracil, 5-methoxy-2-thiouracil, 5-n-butoxy-2-thiouracil, 5-methoxy-6-n-propyl-2-thiouracil, 5-bromo-2-thiouracil, 5-chloro-2-thiouracil, 5-fluoro-2-thiouracil, 5-amino-2-thiouracil, 5-amino-6-methyl-2-thiouracil, 5-amino-6-phenyl-2-thiouracil, 5,6-diamino-2-thiouracil, 5-allyl-2-thiouracil, 5-allyl-3-ethyl-2-thiouracil, 5-allyl-6-phenyl-2-thiouracil, 5-benzyl-2-thiouracil, 5-benzyl-6-methyl-2-thiouracil, 5-acetamido-2-thiouracil, 6-methyl-5-nitro-2-thiouracil, 6-amino-2-thiouracil, 6-amino-5-methyl-2-thiouracil, 6-amino-5-n-propyl-2-thiouracil, 6-bromo-2-thiouracil, 6-chloro-2-thiouracil, 6-fluoro-2-thiouracil, 6-bromo-5-methyl-2-thiouracil, 6-hydroxy-2-thiouracil, 6-acetamido-2-thiouracil, 6-n-octyl-2-thiouracil, 6-dodecyl-2-thiouracil, 6-tetradodecyl-2-thiouracil, 6-hexadecyl-2-thiouracil, 6-(2-hydroxyethyl)-2-thiouracil, 6-(3-isopropyloctyl)-5-methyl-2-thiouracil, 6-(m-nitrophenyl)-2-thiouracil, 6-(m-nitrophenyl)-5-n-propyl-2-thiouracil, 6-α-naphthyl-2-thiouracil, 6-α-naphthyl-5-tert-butyl-2-thiouracil, 6-(p-chlorophenyl)-2-thiouracil, 6-(p-chlorophenyl)-2-ethyl-2-thiouracil, 5-ethyl-6-eicosyl-2-thiouracil, 6-acetamido-5-ethyl-2-thiouracil, 6-eicosyl-5-allyl-2-thiouracil, 5-amino-6-phenyl-2-thiouracil, 5-amino-6-(p-chlorophenyl)-2-thiouracil, 5-methoxy-6-phenyl-2-thiouracil, 5-ethyl-6-(3,3-dimethyloctyl)-2-thiouracil, 6-(2-bromoethyl)-2-thiouracil.

In another embodiment wherein said inventive composition comprises at least one heterocyclic thiol chosen from the above general structures (H1), (H2) or (H3), or tautomers thereof such heterocyclic thiols may be selected from the group consisting of unsubstituted triazole thiol, substituted triazole thiol, unsubstituted imidazole thiol, substituted imidazole thiol, substituted triazine thiol, unsubstituted triazine thiol, a substituted mercapto pyrimidine, unsubstituted mercapto pyrimidine, a substituted thiadiazole-thiol, unsubstituted thiadiazole-thiol, substituted indazole thiol, unsubstituted indazole thiol, tautomers thereof, and combinations thereof.

In another embodiment wherein said inventive composition comprises at least one heterocyclic thiol chosen from the above general structures (H1), (H2) or (H3), or tautomers thereof such heterocyclic thiols may be selected from the group consisting of 1,3,5-triazine-2,4,6-trithiol, 2-mercapto-6-methylpyrimidin-4-ol, 3-mercapto-6-methyl-1,2,4-triazin-5-ol, 2-mercaptopyrimidine-4,6-diol, 1H-1,2,4-triazole-3-thiol, 1H-1,2,4-triazole-5-thiol, 1H-imidazole-2-thiol, 1H-imidazole-5-thiol, 1H-imidazole-4-thiol, 2-azabicyclo[3.2.1]oct-2-ene-3-thiol, 2-azabicyclo[2.2.1]hept-2-ene-3-thiol, 1H-benzo[d]imidazole-2-thiol, 2-mercapto-6-methylpyrimidin-4-ol, 2-mercaptopyrimidin-4-ol, 1-methyl-1H-imidazole-2-thiol, 1,3,4-thiadiazole-2,5-dithiol, 1H-indazole-3-thiol, tautomers thereof and combinations thereof.

Surface Levelling Agent

In one embodiment of the above described inventive compositions it further comprises at least one optional surface leveling agents may include surfactants. In this embodiment, there is no particular restriction with regard to the surfactant, and the examples of it include a polyoxyethylene alkyl ether such as polyoxyethylene lauryl ether, polyoxyethylene stearyl ether, polyoxyethylene cetyl ether, and polyoxyethylene olein ether; a polyoxyethylene alkylaryl ether such as polyoxyethylene octylphenol ether and polyoxyethylene nonylphenol ether; a polyoxyethylene polyoxypropylene block copolymer; a sorbitane fatty acid ester such as sorbitane monolaurate, sorbitane monovalmitate, and sorbitane monostearate; a nonionic surfactant of a polyoxyethylene sorbitane fatty acid ester such as polyoxyethylene sorbitane monolaurate, polyoxyethylene sorbitane monopalmitate, polyoxyethylene sorbitane monostearate, polyethylene sorbitane trioleate, and polyoxyethylene sorbitane tristearate; a fluorinated surfactant such as F-Top EF301, EF303, and EF352 (manufactured by Jemco Inc.), Megafac F171, F172, F173, R08, R30, R90, and R94 (manufactured by Dainippon Ink & Chemicals, Inc.), Florad FC-430, FC-431, FC-4430, and FC-4432 (manufactured by Sumitomo 3M Ltd.), Asahi Guard AG710, Surflon S-381, S-382, S-386, SC101, SC102, SC103, SC104, SC105, SC106, Surfinol E1004, KH-10, KH-20, KH-30, and KH-40 (manufactured by Asahi Glass Co., Ltd.); an organosiloxane polymer such as KP-341, X-70-092, and X-70-093 (manufactured by Shin-Etsu Chemical Co., Ltd.); and an acrylic acid or a methacrylic acid polymer such as Polyflow No. 75 and No. 95 (manufactured by Kyoeisha Chemical Co. Ltd.).

Acid Quenchers

Suitable acid quenchers include, but are not limited to, a basic material or combination of materials such as an amine compound or a mixture of amine compounds having a boiling point above 100° C., at atmospheric pressure, and a $pK_a$ of at least 1. Such acid quenchers include, but are not limited to, amine compounds having structures (XIIa), (XIIb), (XIIc), (XIId), (XIIe), (XIIf), (XIIg), (XIIh), (XIIi) (XIIj), (XIIk) and (XIIl) or a mixture of compounds from this group; wherein $R_{b1}$ is C-1 to C-20 saturated alkyl chain or a C-2 to C-20 unsaturated alkyl chain; $R_{b2}$, $R_{b3}$, $R_{b4}$, $R_{b5}$, $R_{b6}$, $R_{b7}$, $R_{b8}$, $R_{b9}$, $R_{b10}$, $R_{b11}$, $R_{b12}$ and $R_{b13}$, are independently selected from the group of H, and a C-1 to C-20 alkyl as shown below:

(XIIa)

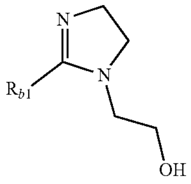

-continued (XIIb)

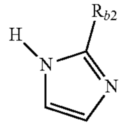

(XIIc)

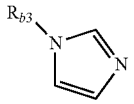

(XIId)

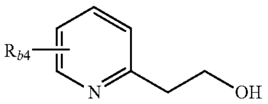

(XIIe)

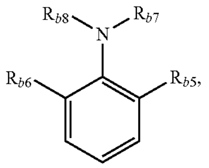

(XIIf)

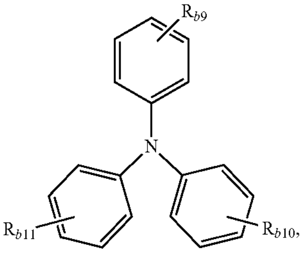

(XIIg)

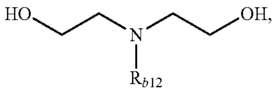

(XIIh)

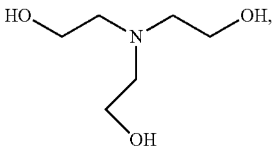

(XIIi)

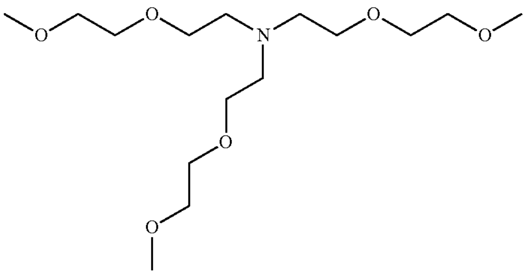

, (XIIj)

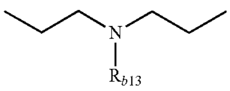

, (XIIk)

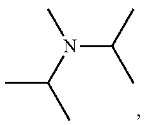

,

-continued (XIII)

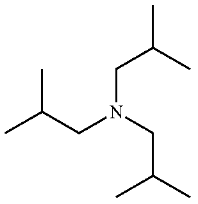

Other suitable acid quenchers are tetraalkylammonium or trialkylammonium salts of carboxylic acid. Specific non limiting examples are mono(tetraalkyl ammonium) of dicarboxylic acid, di(tetraalkyl ammonium) salts of dicarboxylic acid, mono(trialkyl ammonium) of dicarboxylic acid, or di(trialkyl ammonium) salts of dicarboxylic acid. Non-limiting examples of suitable dicarboxylic acid for these salts are oxalic acid, maleic acid, malonic acid, fumaric acid, phthalic acid. and the like. Structure (XIIma) to (XIImd) gives a general structure for such materials wherein Rqa to Rqc are independently a C-4 to C-8 alkyl group, Rqe is a valence bond, an arylene moiety, a C-1 to C-4 alkylene moiety, an alkenyl moiety (—C(Rqf)=C(Rqg)-, wherein Rqf and Rqg are independently H or a C-1 to C-4 alkyl). Structure (XIImd) gives a specific example of such a material.

(XIIma)

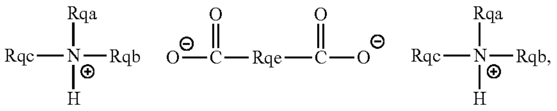

(XIImb)

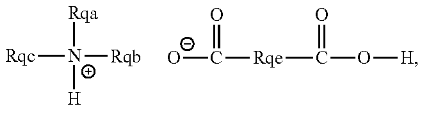

(XIImc)

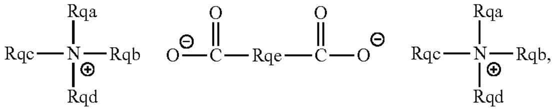

(XIImd)

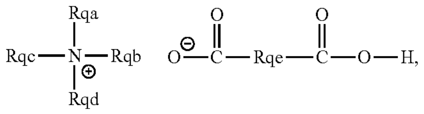

(XIIme)

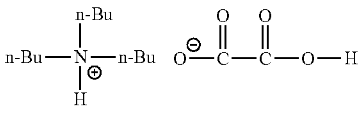

Processing

Another aspect of this invention is the process of coating a substrate comprising applying any one of the above described inventive compositions on a substrate.

Another aspect of this invention is the process for imaging a resist comprising the steps;

i) coating the composition of any of the inventive composition described herein on a substrate to form a resist film;

ii) selectively exposing the resist film to UV light using a mask to form a selectively exposed resist film;

iii) developing the selectively exposed film to form a positively imaged resist film over the substrate.

Another aspect of this invention is the process for imaging a resist comprising the steps;

ia) coating of any of the inventive composition described herein on a substrate to form a resist film;

iia) selectively exposing the resist film to UV light using a mask to form a selectively exposed resist film;

iiia) baking the selectively exposed resist film to form a baked selectively exposed resist film;

iva) developing the selectively exposed and baked resist film to form a positively imaged resist film over the substrate.

Another aspect of this invention is the use of the above described inventive composition for coating a substrate.

Yet another aspect of this invention is the use of the above described inventive composition for forming a resist film on a substrate, preferably an imaged resist film.

EXAMPLES

Reference will now be made to more specific embodiments of the present disclosure and experimental results that provide support for such embodiments. The examples are given below to more fully illustrate the disclosed subject matter and should not be construed as limiting the disclosed subject matter in any way.

It will be apparent to those skilled in the art that various modifications and variations can be made in the disclosed subject matter and specific examples provided herein without departing from the spirit or scope of the disclosed subject matter. Thus, it is intended that the disclosed subject matter, including the descriptions provided by the following examples, covers the modifications and variations of the disclosed subject matter that come within the scope of any claims and their equivalents.

Materials

APS-437 is a surfactant: from Shinetsu, (Tokyo, Japan).

NIT PAG, N-hydroxynaphthalimide triflate is sold under the name (NIT PAG, 100%, Tech, pdr), sold by Heraeus PM NA Daychem LLC. Mono-tributylammonium oxalate was prepared according to US20190064662A1 as described in Synthesis example 1.

Acrylic polymer P11 (Structure P11) (CPR215)

Structure P11

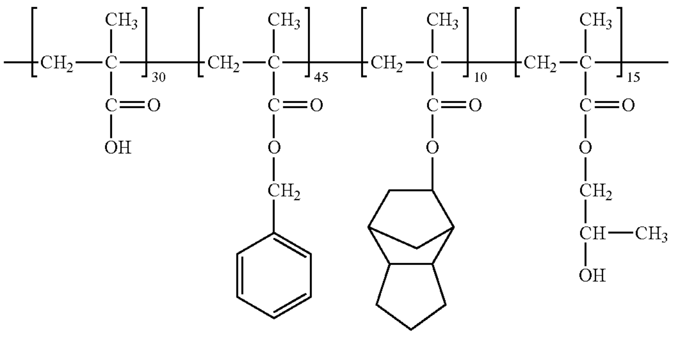

Poly[methacrylic acid-co-benzyl methacrylate-co-tricyclo(5.2.1.0/2.6) decyl methacrylate-co-2-hydroxypropyl methacrylate was obtained from Miwon Commercial Co., Ltd. (Miwon Bldg, 464 Anyang-ro, Manan-gu, Anyang-si, Gyeonggi-do, 430-806, Korea) this polymer had a dissolution rate: 135 Å/sec in 0.26 N aqueous TMAH.

MTA: additive, (1H-1,2,4-triazole-3-thiol) purchased from Sigma Aldrich subsidiary of Merck KGaA (Darmstadt, Germany).

PGME (1-Methoxy-2-propanol) was obtained from Sigma-Aldrich a subsidiary of Merck KGaA (Darmstadt, Germany).

PGMEA (1-Methoxy-2-propanyl acetate) was obtained from Sigma-Aldrich a subsidiary of Merck KGaA (Darmstadt, Germany).

Dissolution Experiments

Dissolution experiments to measure dissolution rates of films of acrylate polymers coatings or unexposed resist formulation coatings (a.k.a. dark erosion) were done with AZ 300 MIF Developer (a.k.a. 0.26 N aqueous TMAH), at 23° C. The dissolution rate was obtained by measuring the film thickness before and after development. The dissolution rate was obtained by dividing the film thickness difference divided by the develop time.

Coating of Formulations:

All formulations were tested on 6 or 8" diameter Si and Cu wafers. The Si wafers were rehydration baked and vapor primed with hexamethyldisilazane (HMDS). The Cu wafers were silicon wafers coated with 5,000 Angstroms of silicon dioxide, 250 Angstroms of tantalum nitride, and 3,500 Angstroms of Cu (PVD deposited).

The resist coatings were prepared by spin coating the resist samples and applying a soft bake for 120 seconds at 110° C. on standard wafer track hot plate in contact mode. The spin speed was adjusted to obtain 5 to 10-microns thick resist films. All film thickness measurements were conducted on Si wafers using optical measurements.

Imaging:

The wafers were exposed on SUSS MA200 CC Mask Aligner or on ASML 250 i-line stepper. The resist was waited for 10-60 mins without post exposure baking and then puddle developed for 120 to 360 seconds in AZ 300 MIF (0.26N aqueous solution of tetramethyl ammonium hydroxide=TMAH) at 23° C. The developed resist images were inspected using Hitachi S4700 or AMRAY 4200L electron microscopes.

Novolak Polymers

For the following formulation examples, three Novolak polymers were used: Novolak-1 is a m-cresol and formaldehyde Novolak and was obtained from Allnex (Alpharetta, Ga) under the name "ALNOVOL™ SPN 560/47MPAC SLOW," Mw 24010, D: 7.3 and had a bulk dissolution rate in 0.26 N aqueous TMAH developer of 700 Å/sec. Novolak-2 is a m-cresol and formaldehyde Novolak and was obtained from Allnex (Alpharetta, Ga) under the name "ALNOVOL™ SPN 560/47MPAC FAST," Mw 7,245, D: 4.8 and had a bulk dissolution rate in 0.26 N aqueous TMAH developer of 1,600 Å/sec. Novolak-3 is a 1/1 wt/wt blend of Novolak-1 and Novolak-2, with a bulk dissolution rate in 0.26 N aqueous TMAH developer of 1,000 Å/sec. Novolak CL23 is a Novolak polymer (sold under the name CL23F10G by Asahi Yukizai Corporation) that includes 50% m-cresol, 20% p-cresol an 30% 2,5-xylenols, formaldehyde with a M, =4,000 and a dissolution rate of 157.5 Å/sec in 0.26 N aqueous TMAH.

AZ 300MIF developer was obtained from EMD Performance Materials Corp, a subsidiary of Merck KGaA (Darmstadt, Germany) (a.k.a. 2.38% Tetramethylammonium hydroxide (TMAH)).

All other chemical unless otherwise not were obtained from Sigma-Aldrich a subsidiary of Merck KGaA (Darmstadt, Germany).

Molecular weights of polymers were measured with Gel Permeation Chromatography (GPC).

Polymer Synthesis of Starting Acrylates and Description of Starting Commercial Acrylate Synthesis Example 1

(Structure P1)

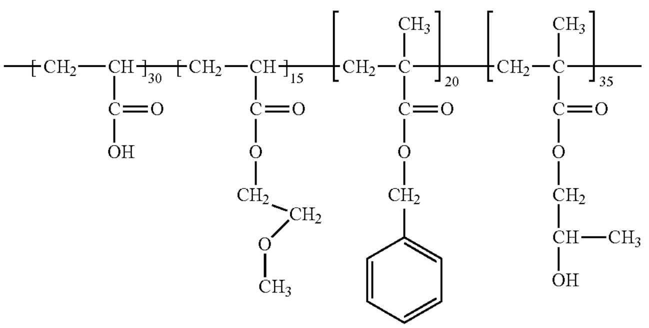

10.81 g of acrylic acid, 9.76 g of methoxyethyl acylate, 17.62 g of benzyl methacrylate, 25.23 g of hydroxypropyl methacrylate were mixed in 95.2 g of propyleneglycol monomethylether (PGME) solvent. The polymerization reaction proceeded in the presence of 1.35 g of AIBN at 90° C., under nitrogen for 18 hours. After cooling to room temperature, the reaction mixture was precipitated in DI water. The white polymer solid was washed and dried under vacuum at 50° C. to yield 63.0 g (99.3% yield) of acrylic resin P1 with a weight average molecular weight of 25003 and a number average molecular weight of 12470. Dissolution rate: 12,600 Å/sec.

Synthesis Example 2

(Structure P2)

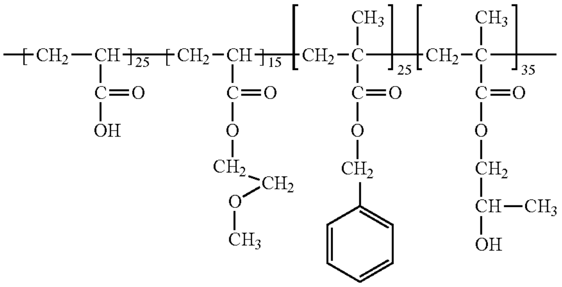

9.00 g of acrylic acid, 9.76 g of methoxyethyl acylate, 22.03 g of benzyl methacrylate, 25.23 g of hydroxypropyl methacrylate were mixed in 101 g of propyleneglycol monomethylether (PGME) solvent. The polymerization reaction proceeded in the presence of 1.35 g of AIBN at 90° C. under nitrogen for 18 hours. After cooling to room temperature, the reaction mixture was precipitated in DI water. The white polymer solid was washed and dried under vacuum at 50° C. to yield 66.0 g (99.3% yield) of acrylic resin P2 with a weight average molecular weight of 30035. Dissolution rate: 8600 Å/sec.

Synthesis Example 3

(Structure P3)

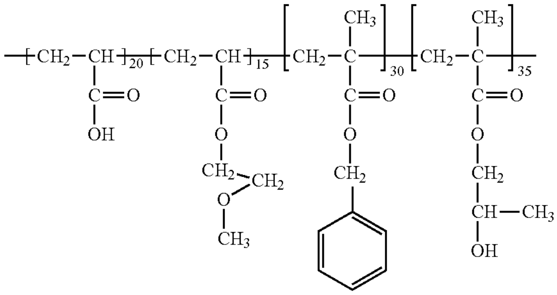

28.82 g of acrylic acid, 39.04 g of methoxyethyl acylate, 105.73 g of benzyl methacrylate, 100.92 g of hydroxypropyl methacrylate were mixed in 420 g of propyleneglycol monomethylether (PGME) solvent. The polymerization reaction proceeded in the presence of 5.42 g of AIBN at 90° C., under nitrogen for 18 hours. After cooling to room temperature, the reaction mixture was used as is (appropriate 40% solid content). Acrylic resin P3 has a weight average molecular weight of 21305 and a number average molecular weight 9798. Dissolution rate: 6580 Å/sec.

Synthesis Example 4

(Structure P4)

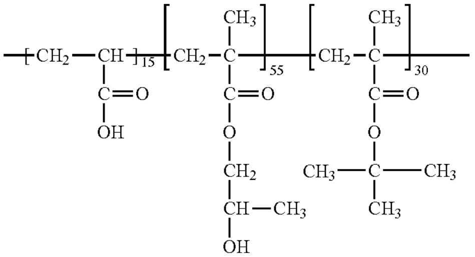

5.40 g of acrylic acid, 39.65 g of hydroxypropyl methacrylate, 21.33 g of tert-butyl methacrylate were mixed in 126.3 g of PGME solvent. The polymerization reaction proceeded in the presence of 1.64 g of AIBN at 90° C., under nitrogen for 18 hours. After cooling to room temperature, the reaction mixture was precipitated in DI water. The white polymer solid was washed and dried under vacuum at 50° C. to yield 64.58 g (97% yield) of acrylic resin P4 with a weight average molecular weight of 18734 and a number average molecular weight 8321. Dissolution rate: 1088 Å/sec.

Synthesis Example 5

(Structure P5)

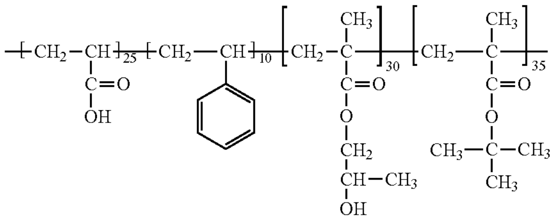

9.01 g of acrylic acid, 5.28 g of Styrene, 21.62 g of hydroxypropyl methacrylate, 24.89 g of tert-butyl methacrylate were mixed in 115.8 g of PGME solvent. The polymerization reaction proceeded in the presence of 1.64 g of AIBN at 80° C., under nitrogen for 18 hours. After cooling to room temperature, the reaction mixture was precipitated in DI water. The white polymer solid was washed and dried under vacuum at 50° C. to yield 59.67 g (98% yield) of acrylic resin P5 with a weight average molecular weight of 21457 and a number average molecular weight 9377. Dissolution rate: 840 Å/sec.

Synthesis Example 6

(Structure P6)

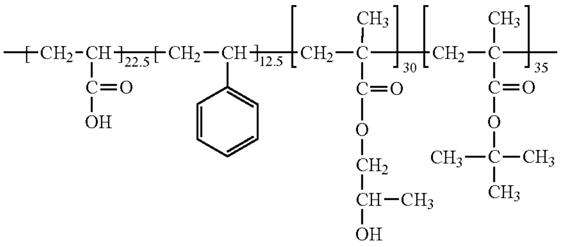

8.11 g of acrylic acid, 6.51 g of styrene, 21.62 g of hydroxypropyl methacrylate, 24.89 g of tert-butyl methacrylate were mixed in 76.2 g of PGME solvent. The polymerization reaction proceeded in the presence of 1.23 g of AIBN at 90° C., under nitrogen for 18 hours. After cooling down to room temperature, the reaction mixture was precipitated in DI water. The white polymer solid was washed and dried under vacuum at 50° C. to yield 60.50 g (99% yield) of acrylic resin P6 with a weight average molecular weight of 18672 and a number average molecular weight of 10817. Dissolution rate: 580 Å/sec.

Synthesis Example 7

(Structure P7)

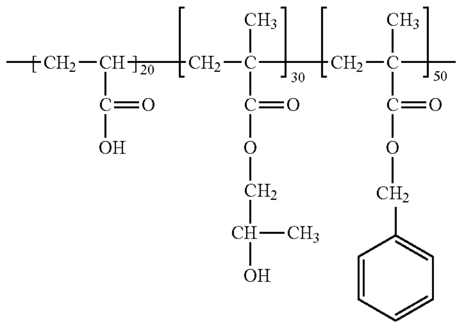

7.21 g of acrylic acid, 21.62 g of hydroxypropyl methacrylate, 44.05 g of benzyl methacrylate were mixed in 138.4 g of PGME solvent. The polymerization reaction proceeded in the presence of 1.6 g of AIBN at 90° C., under nitrogen for 18 hours. After cooling to room temperature, the reaction mixture was precipitated in DI water. The white polymer solid was washed and dried under vacuum at 50° C. to yield 71.4 g (98% yield) of acrylic resin P7 with a weight average molecular weight of 15929 and a number average molecular weight 8007. Dissolution rate: 920 Å/sec.

Synthesis Example 8

(Structure P8)

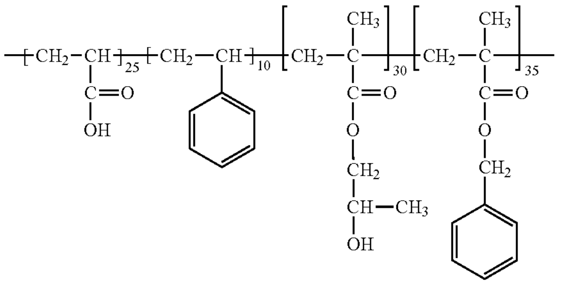

9.01 g of acrylic acid, 5.21 g of styrene, 21.62 g of hydroxypropyl methacrylate, 30.84 g of benzyl methacrylate were mixed in 126.9 g of PGME solvent. The polymerization reaction proceeded in the presence of 1.64 g of AIBN at 90° C., under nitrogen for 18 hours. After cooling to room temperature, the reaction mixture was precipitated in DI water. The white polymer solid was washed and dried under vacuum at 50° C. to yield 64.9 g (97% yield) of acrylic resin P8 with a weight average molecular weight of 15314 and a number average molecular weight of 7843. Dissolution rate 840 Å/sec.

Synthesis Example 9

(Structure P9)

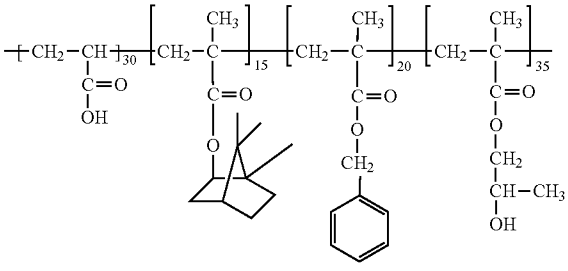

10.81 g of acrylic acid, 16.67 g of isobornyl methacylate, 17.62 g of benzyl methacrylate, 25.23 g of hydroxypropyl methacrylate were mixed in 105.7 g of propyleneglycol monomethylether (PGME) solvent. The polymerization reaction proceeded in the presence of 1.35 g of AIBN at 90° C., under nitrogen for 18 hours. After cooling to room temperature, the reaction mixture was precipitated in DI water. The white polymer solid was washed and dried under vacuum at 50° C. to yield 70.0 g (99.5% yield) of acrylic resin P9 with a weight average molecular weight of 25535 and a number average molecular weight 11607. Dissolution rate: 680 Å/sec.

(Structure P10)

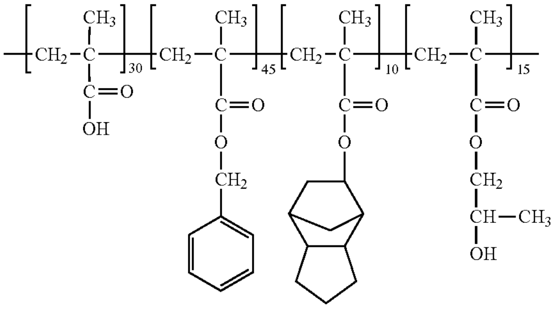

Poly[methacrylic acid-co-benzyl methacrylate-co-tricyclo(5.2.1.0/2.6) decyl methacrylate-co-2-hydroxypropyl methacrylate was obtained from Miwon Commercial Co., Ltd. (Miwon Bldg, 464 Anyang-ro, Manan-gu, Anyang-si, Gyeonggi-do, 430-806, Korea) this polymer had a dissolution rate: 135 Å/sec in 0.26 N aqueous TMAH. It has a weight average molecular weight of 15470 and a number average molecular weight 8594.

Synthesis of Acetal Protected Acrylates

Acetalization Example 1: (3044-49A)

(Structure AB-1)

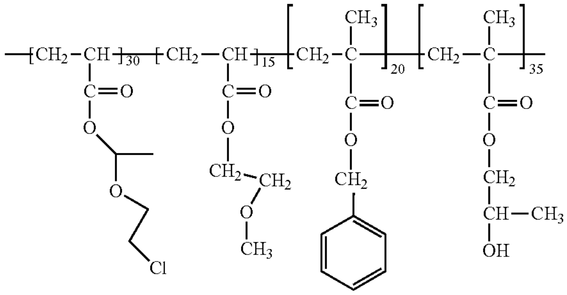

13.2.0 gram of polymer P1, 3.58 gram of 2-chloroethyl vinyl ether and 0.01 gram of citric acid were mixed in 19.8 g of PGMEA. The reaction proceeded at 50° C. for 24 hours. The resulting polymer has a weight average molecular weight of 27503 and a number average molecular weight 12570. The resulting solution was used for formulation. Dissolution rate in AZ 300MIF developer is 0 Å/sec. Acetal Blocked polymer AB-1.

Acetalization Example 2

(Structure AB-2)

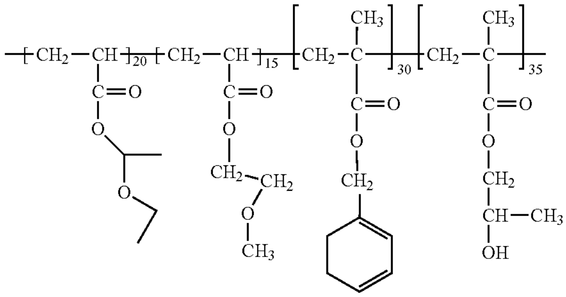

100 grams of polymer P3 solution and 7.1 grams of ethyl vinyl ether were mixed in a flask. The reaction proceeded at 50° C. for 24 hours. The resulting polymer has a weight average molecular weight of 23354 and a number average molecular weight 9878. The obtained solution was used for formulation. Dissolution rate: 9 Å/sec. Acetal Blocked polymer AB-2.

Acetalization Example 3

(Structure AB-3)

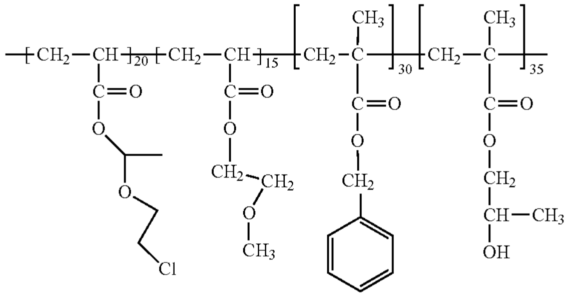

100 grams of polymer P3 solution and 7.5 grams of 2-chloroethyl vinyl ether were mixed in a flask. The reaction proceeded at 50° C. for 24 hours. The resulting polymer has a weight average molecular weight of 29305 and a number average molecular weight 10594. The obtained solution was used for formulation. Dissolution rate: 0 Å/sec. Acetal Blocked polymer AB-3.

Acetalization Example 4

(Structure AB-4)

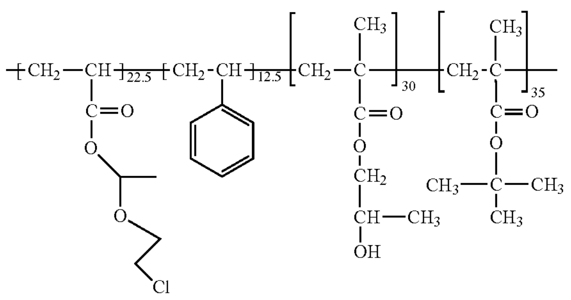

37.1 gram polymer P6, 8.0 gram of 2-chloroethyl vinyl ether and 37.6 grams of PGMEA were mixed in a flask. The reaction proceeded at 40° C. for 24 hours. The resulting polymer has a weight average molecular weight of 20539 and a number average molecular weight 10903. The obtained solution was used for formulation. Dissolution rate: 0 Å/sec. Acetal Blocked polymer AB-4.

Acetalization Example 5

(Structure AB-5)

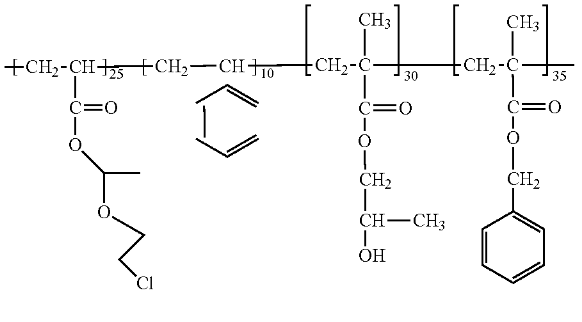

42.11 gram of polymer P8, 8.4 gram of 2-chloroethyl vinyl ether and 42.11 grams of PGMEA were mixed in a flask. The reaction proceeded at 50° C. for 24 hours. The resulting polymer has a weight average molecular weight of 16845 and a number average molecular weight 7906. The obtained solution was used for formulation. Dissolution rate: 0 Å/sec. Acetal Blocked polymer AB-5.

Acetalization Example 6

(Structure AB-6)

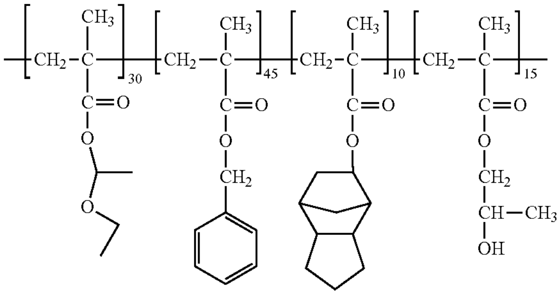

16.7 gram of CPR215 P10 (Miwon, Korea), 2.47 gram of ethyl vinyl ether and 0.03 gram of citric acid were mixed in 25.7 g of PGMEA in a flask. The reaction proceeded at 50° C. for 24 hours. The resulting polymer has a weight average molecular weight of 17018 and a number average molecular weight 8663. The obtained solution was used for formulation. Dissolution rate: 7.8 Å/sec. Acetal Blocked polymer AB-6.

Synthesis of Tert-Alkyl Protected Acrylates

Tert-Butyl Blocked Acrylic Polymer Synthesis Example 1

(Structure TB-1)

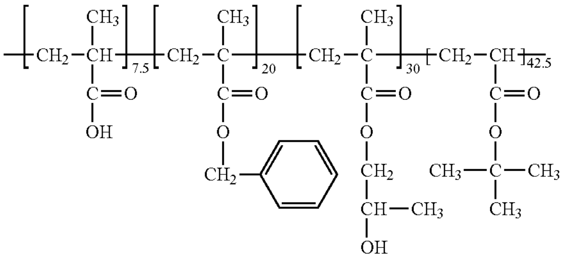

Monomer repeat unit percentages are given as mole percentages. In this example, 6.46 g of methacrylic acid, 35.24 g of benzyl methacrylate, 43.25 g of hydroxypropyl methacrylate, 54.47 g of tert-butyl acrylate are mixed in 209.1 g of PGME solvent. The polymerization reaction proceeds in the presence of 2.3 g of AIBN at 90° C., under nitrogen for 18 hours. After cooling down to room temperature, the reaction mixture is precipitated in DI water. The polymer solid is washed and dried under vacuum at 45° C., yielding 137.1 g (98% yield) with a GPC (using polystyrene standards) weight average molecular weight of 15,072 Daltons and a number average molecular weight of 7345 Daltons.

Tert-Butyl Blocked Acrylic Polymer Synthesis

Example 2

(Structure TB-2)

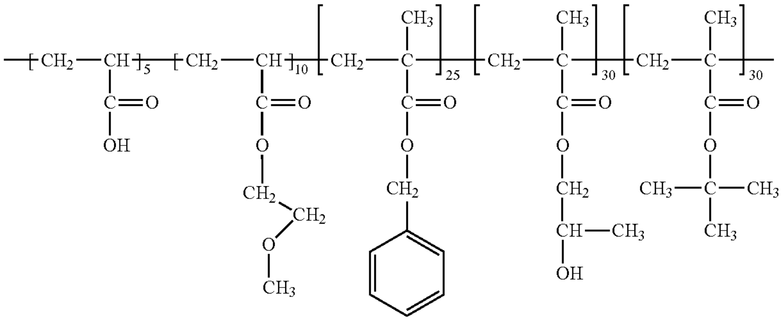

1.8 g of acrylic acid, 6.5 g of methoxyethyl acylate, 22.0 g of benzyl methacrylate, 21.6 g of hydroxypropyl methacrylate, 21.3 g of tert-butyl methacrylate were mixed in 179.6 g of PGME solvent. The polymerization reaction proceeded in the presence of 3.3 g of AIBN at 80° C., under nitrogen for 18 hours. After cooling down to room temperature, the reaction mixture was precipitated in DI water. The white polymer solid was washed and dried under vacuum at 45° C., yielding 73.5 g (>99% yield) with a GPC (using polystyrene standards) weight average molecular weight of 11,868 Daltons and a number average molecular weight of 5382.

Tert-Butyl Blocked Acrylic Polymer Synthesis

Example 3

(Structure TB-3)

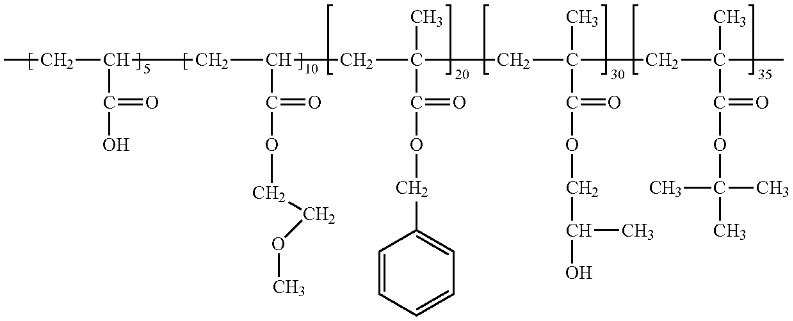

1.8 g of acrylic acid, 6.5 g of methoxyethyl acylate, 17.6 g of benzyl methacrylate, 21.6 g of hydroxypropyl methacrylate, 24.9 g of tert-butyl methacrylate were mixed in 172.9 g of PGME solvent. The polymerization reaction proceeded in the presence of 1.6 g of AIBN at 90° C., under nitrogen for 18 hours. After cooling down to room temperature, the reaction mixture was precipitated in DI water. The white polymer solid was washed and dried under vacuum at 45° C., yielding 71.6 g (99% yield) with a GPC (using polystyrene standards) weight average molecular weight of 17,205 Daltons and a number average molecular weight of 8407.

Tert-Butyl Blocked Acrylic Polymer Synthesis
Example 4

(Structure TB-4)

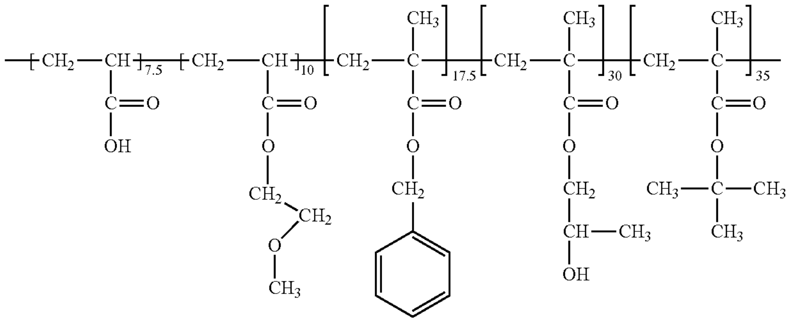

2.7 g of acrylic acid, 6.5 g of methoxyethyl acylate, 15.4 g of benzyl methacrylate, 21.6 g of hydroxypropyl methacrylate, 24.9 g of tert-butyl methacrylate were mixed in 135.2 g of PGME solvent. The polymerization reaction proceeded in the presence of 1.6 g of AIBN at 90° C., under nitrogen for 18 hours. After cooling down to room temperature, the reaction mixture was precipitated in DI water. The white polymer solid was washed and dried under vacuum at 45° C., yielding 70.3 g (99% yield) with a GPC (using polystyrene standards) weight average molecular weight of 17,153 Daltons and a number average molecular weight of 9424.

Tert-Butyl Blocked Acrylic Polymer Synthesis
Example 5

(Structure TB-5)

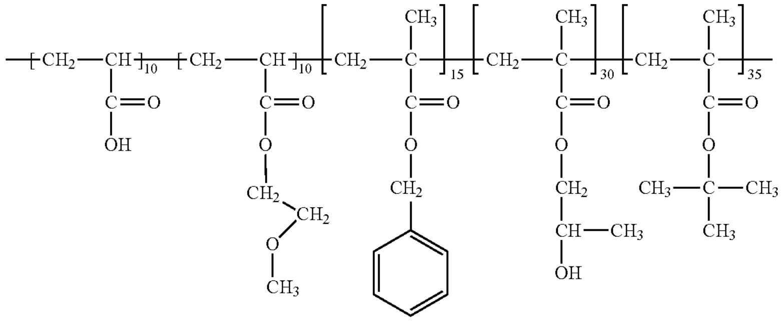

3.6 g of acrylic acid, 6.5 g of methoxyethyl acylate, 13.2 g of benzyl methacrylate, 21.6 g of hydroxypropyl methacrylate, 24.9 g of tert-butyl methacrylate were mixed in 135.8 g of PGME solvent. The polymerization reaction proceeded in the presence of 3.3 g of AIBN at 90° C., under nitrogen for 18 hours. After cooling down to room temperature, the reaction mixture was precipitated in DI water. The white polymer solid was washed and dried under vacuum at 45° C., yielding 70.8 g (>99% yield) with a GPC (using polystyrene standards) weight average molecular weight of 11,913 Daltons and a number average molecular weight of 5564.

Tert-Butyl Blocked Acrylic Polymer Synthesis
Example 6

(Structure TB-6)

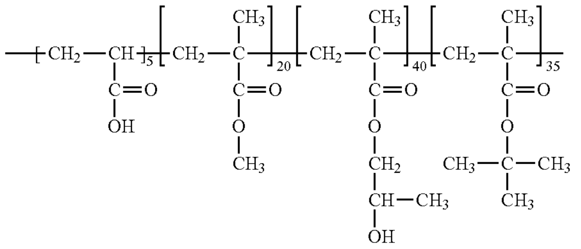

1.8 g of acrylic acid, 10.0 g of methyl methacrylate, 28.8 g of hydroxypropyl methacrylate, 24.9 g of tert-butyl methacrylate were mixed in 124.7 g of PGME solvent. The polymerization reaction proceeded in the presence of 1.6 g of AIBN at 90° C., under nitrogen for 18 hours. After cooling down to room temperature, the reaction mixture was precipitated in DI water. The white polymer solid was washed and dried under vacuum at 45° C., yielding 64.4 g (98% yield) with a GPC (using polystyrene standards) weight average molecular weight of 16,650 Daltons. and a number average molecular weight of 7919.

Tert-Butyl Blocked Acrylic Polymer Synthesis
Example 7

(Structure TB-7)

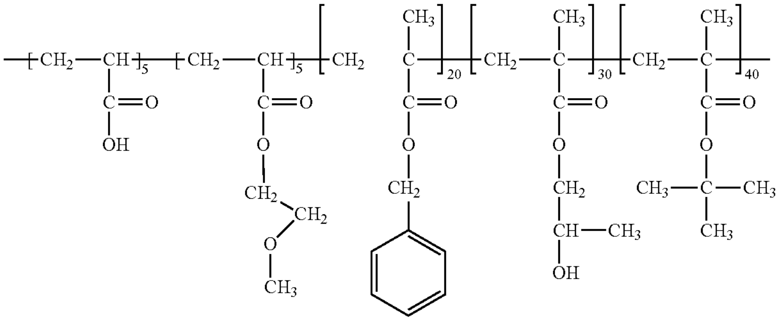

1.8 g of acrylic acid, 3.3 g of methoxyethyl acylate, 17.6 g of benzyl methacrylate, 21.6 g of hydroxypropyl methacrylate, 28.4 g of tert-butyl methacrylate were mixed in 138.2 g of PGME solvent. The polymerization reaction proceeded in the presence of 1.6 g of AIBN at 90° C., under nitrogen for 18 hours. After cooling down to room temperature, the reaction mixture was precipitated in DI water. The white polymer solid was washed and dried under vacuum at 45° C., yielding 71.9 g (99% yield) with a weight average molecular weight of 15,843 Daltons and a number average molecular weight of 7642 Daltons.

Tert-Butyl Blocked Acrylic Polymer Synthesis
Example 8

(Structure TB-8)

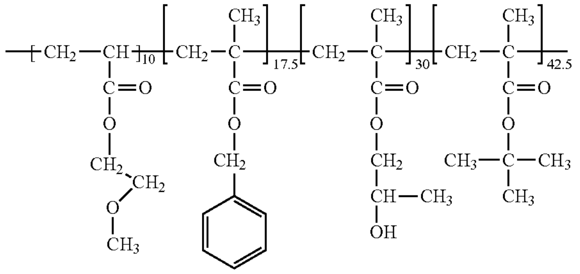

6.5 g of methoxyethyl acylate, 15.4 g of benzyl methacrylate, 21.6 g of hydroxypropyl methacrylate, 30.2 g of tert-butyl methacrylate were mixed in 140.0 g of PGME solvent. The polymerization reaction proceeded in the presence of 1.6 g of AIBN at 90° C., under nitrogen for 18 hours. After cooling down to room temperature, the reaction mixture was precipitated in DI water. The white polymer solid was washed and dried under vacuum at 45° C., yielding 72.45 g (98% yield) with a GPC (using polystyrene standards) weight average molecular weight of 17,525 Daltons. and a number average molecular weight of 8695 Daltons.

Ethylcyclopentyl Blocked Acrylic Polymer Synthesis Example 9

(Structure TB-9)

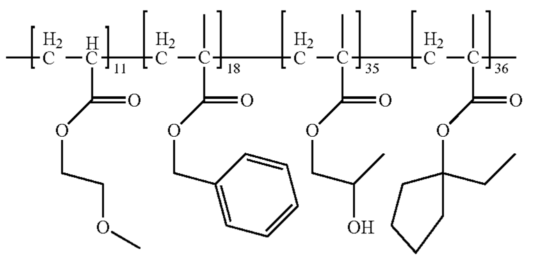

Monomer repeat unit percentages are given as mole percentages. In this example, 7.16 g of methoxyethyl acylate, 15.86 g of benzyl methacrylate, 25.23 g of hydroxypropyl methacrylate, 32.78 g of 1-ethylcyclopentyl methacrylate are mixed in 152.6 g of PGME solvent. The polymerization reaction proceeds in the presence of 1.2 g of AIBN at 90° C., under nitrogen for 18 hours. After cooling down to room temperature, the reaction mixture is precipitated in DI water. The polymer solid is washed and dried under vacuum at 45° C., yielding 79.3 g (98% yield) with a GPC (using polystyrene standards) weight average molecular weight of 17,888 Daltons and a number average molecular weight of 9502.

Ethylcyclopentyl Blocked Acrylic Polymer Synthesis Example 10

(Structure TB-10)

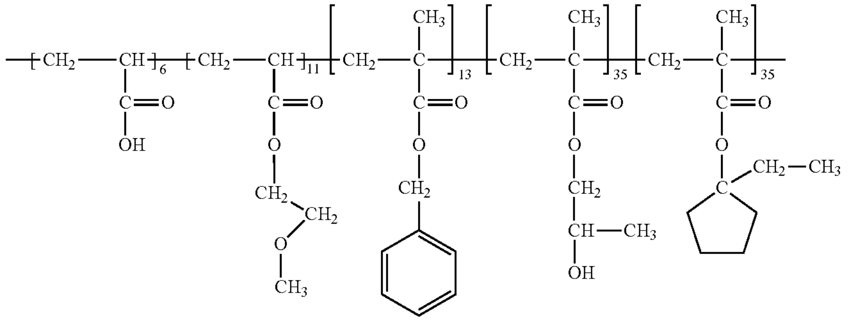

4.32 g of acrylic acid, 14.32 g of methoxyethyl acylate, 22.91 g of benzyl methacrylate, 50.46 g of hydroxypropyl methacrylate, 63.75 g of 1-ethylcyclopentyl methacrylate are mixed in 158.5 g of PGME solvent. The polymerization reaction proceeds in the presence of 2.71 g of AIBN at 90° C., under nitrogen for 18 hours. After cooling down to room temperature, the reaction mixture is precipitated in DI water. The polymer solid is washed and dried under vacuum at 45° C., yielding 153.45 g (98.5% yield) with a GPC (using polystyrene standards) weight average molecular weight of 17,103 Daltons and a number average molecular weight of 8316.

Ethylcyclopentyl Blocked Acrylic Polymer Synthesis Example 11

(Structure TB-11)

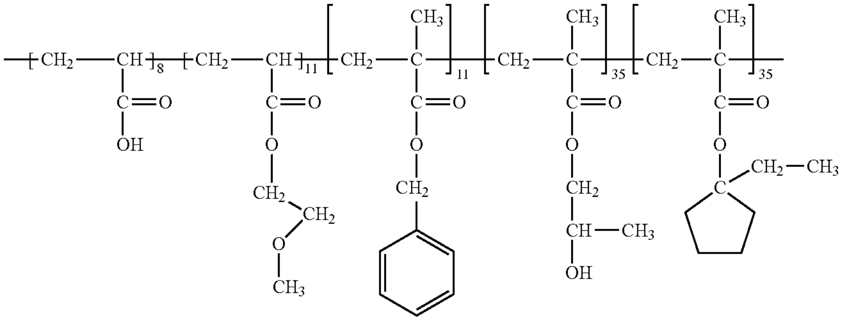

5.76 g of acrylic acid, 14.32 g of methoxyethyl acylate, 19.38 g of benzyl methacrylate, 50.46 g of hydroxypropyl methacrylate, 63.75 g of 1-ethylcyclopentyl methacrylate are mixed in 156.4 g of PGME solvent. The polymerization reaction proceeds in the presence of 2.71 g of AIBN at 90° C., under nitrogen for 18 hours. After cooling down to room temperature, the reaction mixture is precipitated in DI water. The polymer solid is washed and dried under vacuum at 45° C., yielding 150.2 g (97.7% yield) with a GPC (using polystyrene standards) weight average molecular weight of 15,557 Daltons and a number average molecular weight of 7795.

Tert-Butyl Blocked Acrylic Polymer Synthesis Example 12

All formulations were tested on 6 or 8" diameter Si and Cu wafers. The Si wafers were rehydration baked and vapor primed with hexamethyldisilazane (HMDS). The Cu wafers were silicon wafers coated with 5,000 Angstroms of silicon dioxide, 250 Angstroms of tantalum nitride, and 3,500 Angstroms of Cu (PVD deposited).

The resist coatings were prepared by spin coating the resist samples and applying a soft bake for 120 seconds at 110° C. on standard wafer track hot plate in contact mode. The spin speed was adjusted to obtain 17-microns thick resist films. All film thickness measurements were conducted on Si wafers using optical measurements.

(Structure TB-12)

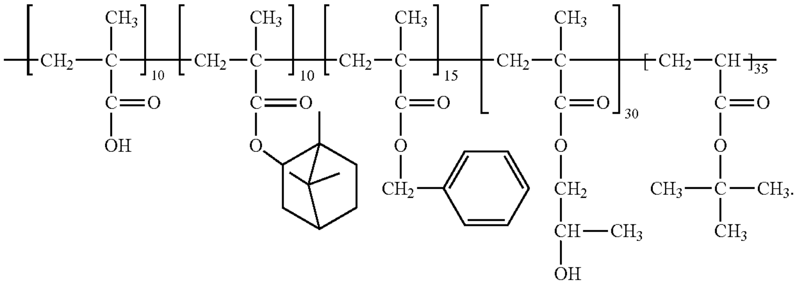

8.61 g of methacrylic acid, 22.23 g of isobornyl methacylate, 26.43 g of benzyl methacrylate, 43.25 g of hydroxypropyl methacrylate, 44.36 g of tert-butyl acrylate are mixed in 156.4 g of PGME solvent. The polymerization reaction proceeds in the presence of 2.46 g of AIBN at 90° C., under nitrogen for 18 hours. After cooling down to room temperature, the reaction mixture is precipitated in DI water. The polymer solid is washed and dried under vacuum at 45° C., yielding 142.5 g (98.3% yield) with a GPC (using polystyrene standards) weight average molecular weight of 25,535 Daltons and a number average molecular weight of 12,215.

Formulation Examples

Coating of Formulations:

All formulations were tested on 8" diameter Si and Cu wafers. The Si wafers were dehydration baked and vapor primed with hexamethyldisilazane (HMDS).

Imaging:

The wafers were exposed on SUSS MA200 CC Mask Aligner or on ASML 250 i-line stepper. The resist was waited for 10-60 mins without post exposure baking and then puddle developed for 120 to 360 seconds in AZ 300 MIF (0.26N aqueous solution of tetramethyl ammonium hydroxide=TMAH) at 23° C. The developed resist images were inspected using Hitachi S4700 or AMRAY 4200L electron microscopes.

Imaging Results

Formulation Example 1: 33.16 g (45.87% solution) of acetal acrylic polymer resin, acetalization example 1, 26.38 g of Novolak-3, 0.32 g of 1,3-dioxo-1H-benzo[de]isoquinolin-2(3H)-yl trifluoromethanesulfonate [also called naphthalene dicarboximidyl triflate, NIT] (NIT PAG), 0.03 g of 1H-1,2,4-triazole-3-thiol, 0.02 g of tributyl ammonium oxalate and 0.03 g of APS-437 were dissolved in 40.06 g of PGMEA solvent to obtain a resist solution at 42.0% solid. This solution was coated on copper wafers and produced 12 um films dried at 110° C. for 120 seconds. The resist was processed to produce patterned images post exposure baked at 70° C. for 60 seconds and developed for 180 seconds.

Formulation Example 2: 34.59 g (43.98% solution) of acetal acrylic polymer resin, acetalization example 2, 26.38 g of Novolak-3, 0.32 g of 1,3-dioxo-1H-benzo[de]isoquinolin-2(3H)-yl trifluoromethanesulfonate [also called naphthalene dicarboximidyl triflate, NIT] (NIT PAG), 0.03 g of 1H-1,2,4-triazole-3-thiol, 0.02 g of mono-tributylammonium oxalate and 0.03 g of APS-437 were dissolved in 38.63 g of PGMEA solvent to obtain a resist solution at 42.0% solid. This solution was coated on copper wafers and produced 12 um films dried at 110° C. for 120 seconds. The resist was processed to produce patterned images post exposure baked at 70° C. for 60 seconds and developed for 180 seconds.

Formulation Example 3: 34.42 g (44.19% solution) of acetal acrylic polymer resin, acetalization example 3, 26.38 g of Novolak-3, 0.32 g of 1,3-dioxo-1H-benzo[de]isoquinolin-2(3H)-yl trifluoromethanesulfonate [also called naphthalene dicarboximidyl triflate, NIT] (NIT PAG), 0.03 g of 1H-1,2,4-triazole-3-thiol, 0.02 g of mono-tributylammonium oxalate and 0.03 g of APS-437 were dissolved in 38.80 g of PGMEA solvent to obtain a resist solution at 42.0% solid. This solution was coated on copper wafers and produced 12 um films dried at 110° C. for 120 seconds. The resist was processed to produce patterned images post exposure baked at 70° C. for 60 seconds and developed for 180 seconds.

Formulation Example 4: 27.90 g (54.53% solution) of acetal acrylic polymer resin, acetalization example 4, 26.38 g of Novolak-3, 0.32 g of 1,3-dioxo-1H-benzo[de]isoquinolin-2(3H)-yl trifluoromethanesulfonate [also called naphthalene dicarboximidyl triflate, NIT] (NIT PAG), 0.03 g of 1H-1,2,4-triazole-3-thiol, 0.02 g of mono-tributylammonium oxalate and 0.03 g of APS-437 were dissolved in 45.32 g of PGMEA solvent to obtain a resist solution at 42.0% solid. This solution was coated on copper wafers and produced 12 um films dried at 110° C. for 120 seconds. The resist was processed to produce patterned images post exposure baked at 70° C. for 60 seconds and developed for 180 seconds.

Formulation Example 5: 27.90 g (54.53% solution) of acetal acrylic polymer resin, acetalization example 5, 26.38 g of Novolak-3, 0.32 g of 1,3-dioxo-1H-benzo[de]isoquinolin-2(3H)-yl trifluoromethanesulfonate [also called naphthalene dicarboximidyl triflate, NIT] (NIT PAG), 0.03 g of 1H-1,2,4-triazole-3-thiol, 0.02 g of mono-tributylammonium oxalate and 0.03 g of APS-437 were dissolved in 45.32 g of PGMEA solvent to obtain a resist solution at 42.0% solid. This solution was coated on copper wafers and produced 12 um films dried at 110° C. for 120 seconds. The resist was processed to produce patterned images post exposure baked at 70° C. for 60 seconds and developed for 180 seconds.

Formulation Example 6: 35.61 g (42.72% solution) of acetal acrylic polymer resin, acetalization example 6, 26.38 g of Novolak-3, 0.32 g of 1,3-dioxo-1H-benzo[de]isoquinolin-2(3H)-yl trifluoromethanesulfonate [also called naphthalene dicarboximidyl triflate, NIT] (NIT PAG), 0.03 g of 1H-1,2,4-triazole-3-thiol, 0.02 g of mono-tributylammonium oxalate and 0.03 g of APS-437 were dissolved in 37.61 g of PGMEA solvent to obtain a resist solution at 42.0% solid. This solution was coated on copper wafers and produced 12 um films dried at 110° C. for 120 seconds. The resist was processed to produce patterned images post exposure baked at 70° C. for 60 seconds and developed for 180 seconds.

Formulation Example 7: 24.80 g (54.53% solution) of acetal acrylic polymer resin, acetalization example 4 (AB-4), 2.02 g of tert-Butyl Blocked Acrylic Polymer Synthesis example 12, 26.38 g of Novolak-3, 0.32 g of 1,3-dioxo-1H-benzo[de]isoquinolin-2(3H)-yl trifluoromethanesulfonate [also called naphthalene dicarboximidyl triflate, NIT] (NIT PAG), 0.03 g of 1H-1,2,4-triazole-3-thiol, 0.02 g of mono-tributylammonium oxalate and 0.03 g of APS-437 were dissolved in 46.40 g of PGMEA solvent to obtain a resist solution at 42.0% solid. This solution was coated on copper wafers and produced 12 um films dried at 110° C. for 120 seconds. The resist was processed to produce patterned images post exposure baked at 70° C. for 60 seconds and developed for 180 seconds.

Formulation Example 8: 23.03 g (54.53% solution) of acetal acrylic polymer resin, acetalization example 4 (AB-4), 2.95 g of tert-Butyl Blocked Acrylic Polymer Synthesis example 12, 26.38 g of Novolak-3, 0.32 g of 1,3-dioxo-1H-benzo[de]isoquinolin-2(3H)-yl trifluoromethanesulfonate [also called naphthalene dicarboximidyl triflate, NIT] (NIT PAG), 0.03 g of 1H-1,2,4-triazole-3-thiol, 0.02 g of mono-tributylammonium oxalate and 0.03 g of APS-437 were dissolved in 47.24 g of PGMEA solvent to obtain a resist solution at 42.0% solid. This solution was coated on copper wafers and produced 12 um films dried at 110° C. for 120 seconds. The resist was processed to produce patterned images post exposure baked at 70° C. for 60 seconds and developed for 180 seconds.

Formulation Example 9: 15.40 g (54.53% solution) of acetal acrylic polymer resin, acetalization example 4 (AB-4), 6.08 g of tert-butyl blocked acrylic polymer synthesis example 12, 26.38 g of Novolak-3, 0.32 g of 1,3-dioxo-1H-benzo[de]isoquinolin-2(3H)-yl trifluoromethanesulfonate [also called naphthalene dicarboximidyl triflate, NIT] (NIT PAG), 0.03 g of 1H-1,2,4-triazole-3-thiol, 0.02 g of mono-tributylammonium oxalate and 0.03 g of APS-437 were dissolved in 51.74 g of PGMEA solvent to obtain a resist solution at 42.0% solid. This solution was coated on copper wafers and produced 12 um films dried at 110° C. for 120 seconds. The resist was processed to produce patterned images post exposure baked at 70° C. for 60 seconds and developed for 180 seconds.

Formulation Example 10: 28.50 g (44.19% solution) of acetal acrylic polymer resin, acetalization example 3 (AB-3), 2.95 g of tert-butyl blocked acrylic polymer synthesis example 12, 26.38 g of Novolak-3, 0.32 g of 1,3-dioxo-1H-benzo[de]isoquinolin-2(3H)-yl trifluoromethanesulfonate [also called naphthalene dicarboximidyl triflate, NIT] (NIT PAG), 0.03 g of 1H-1,2,4-triazole-3-thiol, 0.02 g of mono-tributylammonium oxalate and 0.03 g of APS-437 were dissolved in 41.77 g of PGMEA solvent to obtain a resist solution at 42.0% solid. This solution was coated on copper wafers and produced 12 um films dried at 110° C. for 120 seconds. The resist was processed to produce patterned images post exposure baked at 70° C. for 60 seconds and developed for 180 seconds.

Formulation Example 11: 23.03 g (54.53% solution) of acetal acrylic polymer resin, acetalization example 4 (AB-4), 2.95 g of tert-butyl blocked polymer synthesis example 5, 26.38 g of Novolak-3, 0.32 g of 1,3-dioxo-1H-benzo[de]isoquinolin-2(3H)-yl trifluoromethanesulfonate [also called naphthalene dicarboximidyl triflate, NIT] (NIT PAG), 0.03 g of 1H-1,2,4-triazole-3-thiol, 0.02 g of tetrabutyl ammonium oxalate and 0.03 g of APS-437 were dissolved in 47.24 g of PGMEA solvent to obtain a resist solution at 42.0% solid. This solution was coated on copper wafers and produced 12 um films dried at 110° C. for 120 seconds. The resist was processed to produce patterned images post exposure baked at 70° C. for 60 seconds and developed for 180 seconds.

Formulation Example 12: 23.03 g (54.53% solution) of acetal acrylic polymer resin, acetalization example 4 (AB-4), 2.95 g of tert-butyl blocked polymer synthesis example 9, 26.38 g of Novolak-3, 0.32 g of 1,3-dioxo-1H-benzo[de]isoquinolin-2(3H)-yl trifluoromethanesulfonate [also called naphthalene dicarboximidyl triflate, NIT] (NIT PAG), 0.03 g of 1H-1,2,4-triazole-3-thiol, 0.02 g of tetrabutyl ammonium oxalate and 0.03 g of APS-437 were dissolved in 47.24 g of PGMEA solvent to obtain a resist solution at 42.0% solid. This solution was coated on copper wafers and produced 12 um films dried at 110° C. for 120 seconds. The resist was processed to produce patterned images post exposure baked at 70° C. for 60 seconds and developed for 180 seconds.

Formulation Example 13: 23.03 g (54.53% solution) of acetal acrylic polymer resin, acetalization example 4 (AB-4), 2.95 g of tert-butyl blocked polymer synthesis example 11, 26.38 g of Novolak-3, 0.32 g of 1,3-dioxo-1H-benzo[de]isoquinolin-2(3H)-yl trifluoromethanesulfonate [also called naphthalene dicarboximidyl triflate, NIT] (NIT PAG), 0.03 g of 1H-1,2,4-triazole-3-thiol, 0.02 g of tetrabutyl ammonium oxalate and 0.03 g of APS-437 were dissolved in 47.24 g of PGMEA solvent to obtain a resist solution at 42.0% solid. This solution was coated on copper wafers and produced 12 um films dried at 110° C. for 120 seconds. The resist was processed to produce patterned images post exposure baked at 70° C. for 60 seconds and developed for 180 seconds.

Formulations 1 to 6 only containing acetal blocked polymers (a.k.a only component (A)) did not show T-topping of L/S features upon a PED delay of 48 hours, however, these formulations did give rise to a very large decrease in the size of L/S features (a.k.a. line sliming) at the same exposure sizing dose as used at time 0 hours after this post exposure time delay of 48 hours. Therefore, in order to get the same targeted feature size after a PED time of 48 hours a much lower exposure dose was required, for instance lower by 60 mJ/cm$^2$ or more.

However, by using formulations with a mixture of tert-Butyl or ethylcyclopentyl blocked acrylate polymers (a.k.a. Component (B)) [tert-butyl blocked acrylic polymer synthesis examples 1 to 12], with the with the acetalization examples 1 to 6 (a.k.a. Component (A)), PED delay latitude for 48 hours was greatly improved. Specifically, resolution of L/S features at PED time of 48 hours was achieved at the same resolution dose as PED time 0 hours with either greatly decreased line sliming or complete elimination of line slimming. In those cases where some slight line slimming occurred for these acrylate formulations after a PED delay of 48 hours, this could be eliminating by a slight decrease in the dose needed (20 mJ/cm$^2$ or less) to resolve the same sized features after the 48-hour PED. As an example, Formulation Examples 8, showed no change in resolution dose for 5-micron L/S features after a post-exposure delay (PED) of 48 hours showing neither T-topping or lines slimming after this delay time (FIG. 1) similar results were seen for formulations 11 to 13.

For all formulation using a mixture of Acetal protected acrylate and tert-butyl ester protected acrylate none of these formulations showed any sign of T-topping (Table 1 Formulations) after a PED delay of 48 hour. Further, these mixture formulations showed very good dose latitude resolving L/S features of sizes ranging from 2.4 micron to 10 microns at the same resolution dose. Generally, it was found that a wt ratio of component (A) to Component (B) of 2.3 to 9 gives acceptable improvement in the PED latitude.

However, it was found that too low a ratio of component (A) to component (B) where too much tert-butyl or 1-ethylcyclopentyl blocked acrylate polymer, was used in the mixture, the photo-speed was seen to decrease too much (a.k.a. increased dose in mJ/cm$^2$ of 100 mJ/cm2 or more) after a PED equal to 48 hours. A specific example of this was demonstrated for Formulation Example 9, employing a ratio of 1.38 which showed a decrease in photo-speed (increase resolution dose of 120 mJ/cm$^2$) after a PED of 48 hours (Table 1). Conversely, too high a ratio of component (A) to component (B) where this ratio is much larger than 9 gives rise too much of an increase in photospeed making control of line slimming with PED delay difficult.

Other formulations comprising a mixture of component (A) and component (B) achieved similar results as described above.

Although the invention has been described and illustrated with a certain degree of particularity, it is understood that the disclosure has been made only by way of example, and that numerous changes in the conditions and order of steps can be resorted to by those skilled in the art without departing from the spirit and scope of the invention.

Results

TABLE 1

Blended Acetal blocked polymer and tert-alkyl blocked acrylate polymer.

| Formulation | t-butyl blocked wt %/Acetal blocked polymer wt % (wt ratio) | Dose at PED = 0 (mJ/cm$^2$) | Dose at PED = 48 hours (mJ/cm$^2$) | Comment |
|---|---|---|---|---|
| Example 4 | 100 wt %/0 wt % (TB) (NA) | 160 | 100 | Photo-speed faster 60 mJ/cm$^2$ |
| Example 7 | 87 wt %(AB-4)/13 wt % (TB-12) (6.69) | 200 | 180 | Good. Faster 20 mJ/cm$^2$ |
| Example 8 | 81 wt % (AB-4)/19 wt % (TB-12) (4.25) | 180 | 180 | Good. No photospeed change |
| Example 9 | 58 wt %(AB-4)/42 wt %(TB12) (1.38) | 200 | 320 | Photo-speed much slower |
| Example10 | 81 wt %(AB-3)/19 wt % (TB-12) (4.25) | 200 | 180 | Good. Faster 20 mJ/cm$^2$ |

TABLE 1-continued

Blended Acetal blocked polymer and tert-alkyl blocked acrylate polymer.

| Formulation | t-butyl blocked wt %/Acetal blocked polymer wt % (wt ratio) | Dose at PED = 0 ($mJ/cm^2$) | Dose at PED = 48 hours ($mJ/cm^2$) | Comment |
|---|---|---|---|---|
| Example 11 | 81 wt % (AB-4)/19 wt % (TB-5) (4.25) | 200 | 200 | Good. No photospeed change |
| Example 12 | 81 wt % (AB-4)/19 wt % (TB-9) (4.25) | 160 | 160 | Good. No Photospeed change |
| Example 13 | 81 wt % (AB-4)/19 wt % (TB-11) (4.25) | 120 | 120 | Good. No Photospeed change |

What is claimed is:

1. A composition comprising (A) an acetal functionalized acrylic polymer component comprising repeat units selected from the group consisting of ones having structure (1), (2), (3), (4), (5), (6), and (7):

(1)

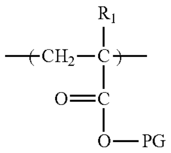

(2)

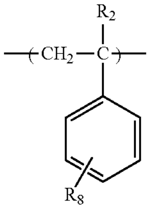

(3)

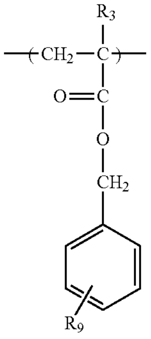

(4)

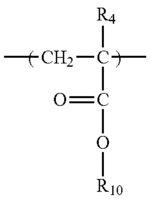

-continued (5)

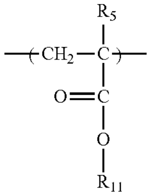

(6)

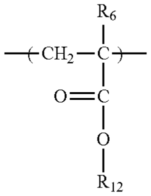

(7)

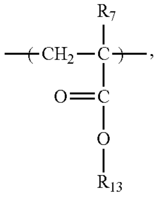

wherein PG is an acid cleavable acetal protecting group, wherein said repeat units constitute 100 mole % of the repeat units in said acetal functionalized acrylic polymer, wherein the repeat unit of structure (1) ranges from about 10 mole % to about 35 mole % of the acrylic polymer, the repeat unit of structure (2) ranges from about 0 mole % to about 20 mole % of the acrylic polymer, the repeat unit of structure (3) ranges from about 15 mole % to about 55 mole % of the acrylic polymer, the repeat unit of structure (4) ranges from about 0 mole % to about 30 mole % of the acrylic polymer, the repeat unit of structure (5) ranges from about 15 mole % to about 55 mole % of the acrylic polymer, the repeat unit of structure (6) ranges from about 0 mole % to about 40 mole % of the acrylic polymer, the repeat unit of structure (7) ranges from about 0 mole % to about 25 mole % of the acrylic polymer, $R_1$, $R_2$, $R_3$, $R_4$, $R_5$, $R_6$, and $R_7$ are individually selected from either H, F, a C-1 to C-4 perfluoroalkyl, or a C-1 to C-4 alkyl, $R_8$ and $R_9$ are individually selected from H, a C-1 to C-4 alkyl, a C-1 to C-4 alkyloxy alkyl, and a halogen, $R_{10}$ is selected from the group consisting of a C-1 to C-8 primary alkyl, a C-3 to C-8 secondary alkyl, a C-3 to C-8 cyclic secondary alkyl, and a C-7 to C-14 alicyclic secondary alkyl, $R_{11}$ a C-2 to C-8 (hydroxy)alkylene moiety, $R_{12}$ is a tertiary alkyl acid cleavable group, and further wherein, $R_{13}$ is a C-3 to C-12, (alkyloxy)alkylene moiety;

(B) a tert-alkyl functionalized acrylic polymer component comprising repeat units selected from the group consisting of ones having structure (1a), (2a), (3a), (4a), (5a), (6a), and (7a):

(1a)

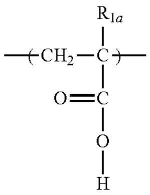

(2a)

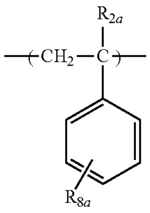

(3a)

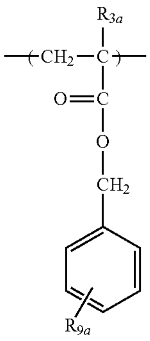

(4a)

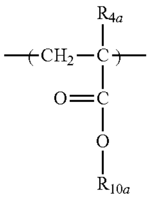

(5a)

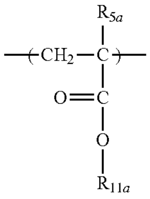

-continued (6a)

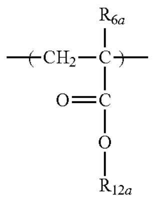

(7a)

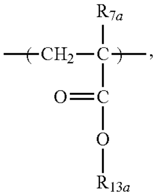

wherein theses repeat units constitute 100 mole % of the repeat units in said tert-alkyl functionalized acrylic polymer, the repeat unit of structure (1a) ranges from about 0 mole % to about 15 mole % of the acrylic polymer, wherein the repeat unit of structure (2a) ranges from about 0 mole % to about 20 mole % of the acrylic polymer, the repeat unit of structure (3a) ranges from about 0 mole % to about 30 mole % of the acrylic polymer, the repeat unit of structure (4a) ranges from about 0 mole % to about 30 mole % of the acrylic polymer, the repeat unit of structure (5a) ranges from about 15 mole % to about 40 mole % of the acrylic polymer, the repeat unit of structure (6a) ranges from about 30 mole % to about 45 mole % of the acrylic polymer, the repeat unit of structure (7a) ranges from about 0 mole % to about 20 mole % of the acrylic polymer, $R_{1a}$, $R_{2a}$, $R_{3a}$, $R_{4a}$, $R_{5a}$, $R_{6a}$, and $R_{7a}$ are individually selected from either H, F, a C-1 to C-4 perfluoroalkyl, or a C-1 to C-4 alkyl, $R_{8a}$ and $R_{9a}$ are individually selected from H, a C-1 to C-4 alkyl, a C-1 to C-4 alkyloxy alkyl, and a halogen, $R_{10a}$ is selected from the group consisting of a C-1 to C-8 primary alkyl, a C-3 to C-8 secondary alkyl, a C-3 to C-8 cyclic secondary alkyl, and a C-7 to C-14 secondary alicyclic alkyl, $R_{11a}$ is a C-2 to C-8 (hydroxy)alkylene moiety, $R_{12a}$ is a tertiary alkyl acid cleavable group, and $R_{13a}$ is a C-3 to C-12, (alkyloxy)alkylene moiety;

(C) a phenolic resin component comprising a Novolak-based resin;

(D) a photo acid generator (PAG) component; and (E) a solvent component, wherein (A) the acetal functionalized polymer component and (B) the tert-alkyl functionalized acrylic polymer component are present in a wt. ratio of (A)/(B) which ranges from about 10 to about 2.3, and further wherein, the resist compositions do not include a diazonaphthoquinone (DNQ) component.

2. The composition of claim 1, wherein (A) the acetal functionalized acrylic polymer component comprises from about 15 mole % to about 35 mole % of the repeat unit of structure (1), from about 15 mole % to about 45 mole % of the repeat unit of structure (3), from about 15 mole % to about 35 mole % of the repeat unit of structure (5), from about 10 mole % to about 25 mole % of the repeat unit of structure (7), wherein said repeat units constitute 100 mole % of the repeat units in said acetal functionalized acrylic polymer.

3. The composition of claim 1, wherein (A) the acetal functionalized polymer component comprises from about 15 mole % to about 20 mole % of the repeat unit of structure (1), from about 5 mole % to about 25 mole % of the repeat unit of structure (2), from about 15 mole % to about 35 mole % of the repeat unit of structure (5), from about 10 mole % to about 40 mole % of the repeat unit of structure (6), wherein said repeat units constitute 100 mole % of the repeat units in said acetal functionalized acrylic polymer.

4. The composition of claim 1, wherein (A) the acetal functionalized acrylic polymer component comprises from about 20 mole % to about 35 mole % of the repeat unit of structure (1), from about 15 mole % to about 50 mole % of the repeat unit of structure (3), from about 15 mole % to about 30 mole % of the repeat unit of structure (5), from about 10 mole % to about 35 mole % of the repeat unit of structure (7), wherein said repeat units constitute 100 mole % of the repeat units in said acetal functionalized acrylic polymer.

5. The composition of claim 1, wherein (B) the tert-alkyl functionalized acrylic polymer component comprises from about 2 mole % to about 15 mole % of the repeat unit of structure (1a), from about 10 mole % to about 25 mole % of the repeat unit of structure (3a), from about 15 mole % to about 30 mole % of the repeat unit of structure (5a), from about 30 mole % to about 45 mole % of the repeat unit of structure (6a), from about 2 mole % to about 15 mole % of the repeat unit of structure (7a), wherein said repeat units constitute 100 mole % of the repeat units in said tert-alkyl functionalized acrylic polymer.

6. The composition of claim 1, wherein (B) the tert-alkyl functionalized acrylic polymer component comprises from about 2 mole % to about 15 mole % of the repeat unit of structure (1a), from about 10 mole % to about 25 mole % of the repeat unit of structure (3a), from about 10 mole % to about 25 mole % of the repeat unit of structure (4a), from about 25 mole % to about 35 mole % of the repeat unit of structure (5a), from about 30 mole % to about 45 mole % of the repeat unit of structure (6a), wherein said repeat units constitute 100 mole % of the repeat units in said tert-alkyl functionalized acrylic polymer.

7. The composition of claim 1, wherein (B) the tert-alkyl functionalized acrylic polymer component from about 5 mole % to about 10 mole % of the repeat unit of structure (1a), from about 10 mole % to about 25 mole % of the repeat unit of structure (3a), from about 25 mole % to about 35 mole % of the repeat unit of structure (5a), from about 35 mole % to about 45 mole % of the repeat unit of structure (6a), wherein said repeat units constitute 100 mole % of the repeat units in said tert-alkyl functionalized acrylic polymer.

8. The composition of claim 1, wherein (B) the tert-alkyl functionalized acrylic polymer component comprises from about 10 mole % to about 25 mole % of the repeat unit of structure (3a), from about 25 mole % to about 35 mole % of the repeat unit of structure (5a), from about 30 mole % to about 45 mole % of the repeat unit of structure (6a), from about 8 mole % to about 15 mole % of the repeat unit of structure (7a), wherein said repeat units constitute 100 mole % of the repeat units in said tert-alkyl functionalized acrylic polymer.

9. The composition of claim 1, wherein (A) the acetal functionalized polymer component and (B) the tert-alkyl functionalized acrylic polymer component are present in a wt. ratio of (A)/(B) which ranges from about 8 to about 2.3.

10. The composition of claim 1, wherein (A) the acetal functionalized polymer component and (B) the tert-alkyl functionalized acrylic polymer component are present in a wt. ratio of (A)/(B) which ranges from about 9 to about 2.3.

11. The composition of claim 1, wherein (A) the acetal functionalized polymer component and (B) the tert-alkyl functionalized acrylic polymer component are present in which ranges from about 9 to about 3.

12. The composition of claim 1, wherein (A) the acetal functionalized polymer component and (B) the tert-alkyl functionalized acrylic polymer component are present in a wt. ratio of (A)/(B) which ranges from about 8 to about 3.5.

13. The composition of claim 1, wherein (A) the acetal functionalized polymer component and (B) the tert-alkyl functionalized acrylic polymer component are present in a wt. ratio of (A)/(B) which ranges from about 7 to about 4.

14. The composition of claim 1, wherein (C) the Novolak-based resin component comprises repeat unit (I):

(I)

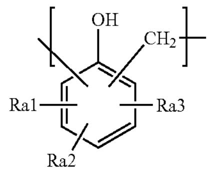

where Ra1, Ra2 and Ra3 are each independently (i) a hydrogen, (ii) an unsubstituted C-1 to C-4 alkyl, (iii) a substituted C-1 to C-4 alkyl, (iv) an unsubstituted-X-Phenol group where X is —O—, $—C(CH_3)_2—$, $—CH_2—$, —(C═O)— or $—SO_2—$ or (v) an substituted-X-Phenol group where X is —O—, $—C(CH_3)_2—$, $—CH_2—$, —(C═O)— or $—SO_2—$.

15. The composition of claim 1, wherein the photo acid generator (PAG) component is an aromatic imide N-oxysulfonate derivatives of an organic sulfonic acid, an aromatic sulfonium salt of an organic sulfonic acid, a trihalotriazine derivative or a mixture thereof.

16. The composition of claim 1, further comprising one or more optional ingredients selected from among an acid quencher, an auxiliary resin, a thiol, a plasticizer, a surface leveling agent and a stabilizer.

17. The composition of claim 16, wherein the thiol is a heterocyclic thiol.

18. A process of coating a substrate comprising applying the composition of claim 1 on the substrate.

19. A process for imaging a resist comprising the steps;

i) coating the composition of claim 1 on a substrate to form a resist film;

ii) selectively exposing the resist film to UV light using a mask to form a selectively exposed resist film;

iii) developing the selectively exposed film to form a positively imaged resist film over the substrate.

20. A process for imaging a resist comprising the steps;

ia) coating the composition of claim 1 on a substrate to form a resist film;

iia) selectively exposing the resist film to UV light using a mask to form a selectively exposed resist film;

iiia) baking the selectively exposed resist film to form a baked selectively exposed resist film;

iva) developing the selectively exposed and baked resist film to form a positively imaged resist film over the substrate.

* * * * *